(12) United States Patent
Song

(10) Patent No.: US 9,240,223 B2
(45) Date of Patent: *Jan. 19, 2016

(54) SEMICONDUCTOR MEMORY DEVICES WITH A POWER SUPPLY

(71) Applicant: SAMSUNG ELECTRONICS CO., LTD., Suwon-si, Gyeonggi-do (KR)

(72) Inventor: Tae-Joong Song, Seongnam-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/272,881

(22) Filed: May 8, 2014

(65) Prior Publication Data

US 2014/0241046 A1    Aug. 28, 2014

Related U.S. Application Data

(63) Continuation of application No. 13/350,958, filed on Jan. 16, 2012, now Pat. No. 8,743,646.

(30) Foreign Application Priority Data

Feb. 15, 2011    (KR) .................. 10-2011-0013111

(51) Int. Cl.
  *G11C 5/14* (2006.01)
  *G11C 8/08* (2006.01)
  *G11C 8/10* (2006.01)

(52) U.S. Cl.
  CPC  *G11C 5/147* (2013.01); *G11C 8/08* (2013.01); *G11C 8/10* (2013.01); *Y10T 307/406* (2015.04)

(58) Field of Classification Search
  CPC ............ G11C 5/147; G11C 5/14; G11C 8/10; G11C 8/08
  USPC .............................................. 365/226, 230.06
  See application file for complete search history.

(56) References Cited

U.S. PATENT DOCUMENTS

| | | | |
|---|---|---|---|
| 5,789,763 A * | 8/1998 | Kato et al. ...................... 257/72 |
| 6,370,063 B2 | 4/2002 | Kim |
| 7,099,197 B2 | 8/2006 | Satomi et al. |
| 7,352,647 B1 * | 4/2008 | Saini ......................... 365/230.03 |
| 8,743,646 B2 * | 6/2014 | Song ............................. 365/226 |
| 2006/0221702 A1 * | 10/2006 | Scheuerlein et al. ..... 365/185.23 |
| 2009/0141580 A1 * | 6/2009 | Evans et al. .............. 365/230.06 |
| 2010/0110763 A1 | 5/2010 | Li et al. |
| 2011/0205829 A1 | 8/2011 | Iida |

FOREIGN PATENT DOCUMENTS

| | | |
|---|---|---|
| JP | 2004-241058 | 8/2004 |
| JP | 2010-129113 | 6/2010 |
| KR | 1020010088007 | 9/2001 |

* cited by examiner

*Primary Examiner* — Huan Hoang

(74) *Attorney, Agent, or Firm* — F. Chau & Associates, LLC

(57) ABSTRACT

A semiconductor device includes a virtual power supplier, a driving signal generator and a load driver. The virtual power supplier boosts a driving voltage to generate a virtual voltage. The driving signal generator generates a driving signal based on the virtual voltage, such that the driving signal has a voltage level that is reinforced as compared with a voltage level of the driving voltage. The load driver drives a load based on the driving voltage and the driving signal.

12 Claims, 21 Drawing Sheets

SEMICONDUCTOR MEMORY DEVICES WITH A POWER SUPPLY

CROSS-REFERENCE TO RELATED APPLICATION(S)

This application is a continuation application of co-pending U.S. application Ser. No. 13/350,958 filed Jan. 16, 2012, which claims priority under 35 USC §119 to Korean Patent Application No. 10-2011-0013111, filed on Feb. 15, 2011, in the Korean Intellectual Property Office (KIPO), the disclosure of which is incorporated by reference in its entirety herein.

BACKGROUND

1. Technical Field

Exemplary embodiments of the inventive concept relate to power supply, and more particularly to semiconductor devices with a power supply.

2. Discussion of Related Art

A semiconductor device may operate at fast operating speeds using a high power supply voltage. However, use of a high power supply voltage may shorten the life of the device by accelerating degeneration of elements such as transistors, increase noise, and cause increased power consumption.

Since mobile devices typically need to operate at high speeds and have a limited amount of battery power, they may be more adversely affected by high power supply voltages.

SUMMARY

At least one exemplary embodiment of the inventive concept provides a semiconductor device that uses a power supply scheme to enhance an operating speed without increasing a power supply voltage.

At least one exemplary embodiment of the inventive concept provides a semiconductor device that uses a power supply scheme to decrease an effect of noise on power supply lines.

At least exemplary embodiment of the inventive concept provides a semiconductor device that uses a power supply scheme to provide stable power in a power-down mode.

A semiconductor device according to an exemplary embodiment of the inventive concept includes a virtual power supplier, a driving signal generator and a load driver. The virtual power supplier boosts a driving voltage to generate a virtual voltage. The driving signal generator generates a driving signal based on the virtual voltage, such that the driving signal has a voltage level that is reinforced compared with a voltage level of the driving voltage. The load driver drives a load based on the driving voltage and the driving signal.

For example, the driving signal generator may be configured to generate a boosted driving signal from supply of the virtual voltage (e.g., virtual voltage is applied to a power supply terminal or ground terminal of the driving signal generator). The boosted driving signal may have a voltage level that is boosted as compared with a voltage level of a driving signal that is generated when the driving signal generator is supplied with the driving voltage (e.g., driving voltage is applied to the power supply terminal or ground terminal of the driving signal generator).

The virtual power supplier may include conductors capacitively-coupled to each other to generate the virtual voltage.

The driving voltage may include a ground voltage and a power supply voltage. The virtual power supplier may boost at least one of the ground voltage and the power supply voltage to generate at least one of a virtual ground voltage and a virtual power supply voltage, such that the virtual ground voltage has a voltage level lower than a voltage level of the ground voltage and the virtual power supply voltage has a voltage level higher than a voltage level of the power supply voltage.

The virtual power supplier may includes a virtual voltage conductor configured to provide the virtual voltage, a boosting conductor capacitively-coupled to the virtual voltage conductor, a switch coupled between the virtual voltage conductor and at least one of a ground voltage and a power supply voltage and configured to control a floating timing of the virtual voltage conductor, and a boosting driver configured to provide a power to the boosting conductor.

The switch of the virtual power supplier may be coupled between the virtual voltage conductor and the ground voltage to provide a virtual ground voltage having a voltage level lower than a voltage level of the ground voltage, and the driving signal generator may generate the boosted driving signal based on the power supply voltage and the virtual ground voltage.

The switch of the virtual power supplier may be coupled between the virtual voltage conductor and the power supply voltage to provide a virtual power supply voltage having a voltage level higher than a voltage level of the power supply voltage, and the driving signal generator may generate the boosted driving signal based on the virtual power supply voltage and the ground voltage.

The virtual power supplier may include a first virtual power supplier and a second virtual power supplier. The first virtual power supplier may include first conductors capacitively-coupled to each other to generate a virtual ground voltage by boosting a ground voltage such that the virtual ground voltage has a voltage level lower than a voltage level of the ground voltage. The second virtual power supplier may include second conductors capacitively-coupled to each other to generate a virtual power supply voltage by boosting a power supply voltage such that the virtual power supply voltage has a voltage level higher than a voltage level of the power supply voltage.

The driving signal generator may generate the boosted driving signal based on the virtual power supply voltage and the virtual ground voltage.

In an exemplary embodiment of the inventive concept, a boosting timing of the ground voltage by the first virtual power supplier and a boosting timing of the power supply voltage by the second virtual power supplier may be controlled based on a common timing control signal. The common timing control signal may be a clock signal of the semiconductor device.

In other exemplary embodiment of the inventive concept, a boosting timing of the ground voltage by the first virtual power supplier may be controlled based on a first timing control signal, and a boosting timing of the power supply voltage by the second virtual power supplier may be controlled based on a second timing control signal different from the first timing control signal.

A semiconductor device according to an exemplary embodiment of the inventive concept includes a first pair of capacitively-coupled conductors, a second pair of capacitively-coupled conductors, a first transistor receiving a power supply voltage and connected to the last conductor of the first pair, a second transistor receiving a ground voltage and connected to the last conductor of the second pair, a first inverter receiving a timing control signal to output an inverted timing control signal to gates of both transistors, a driving signal generator receiving a first output of the last conductor of the first pair and a second output of the last conductor of the second pair, and a load driver receiving an output of the driving signal generator.

A power supply terminal of the driving signal generator may receive the first output and a ground terminal of the driving signal generator may receive the second output. A power supply terminal of the load driver may receive the power supply voltage and a ground terminal of the driving signal generator may receive the ground voltage.

A semiconductor memory device according to an exemplary embodiment of the inventive concept includes a memory cell array including a plurality of memory cells coupled to a plurality of wordlines and a plurality of bitlines, a virtual power supplier configured to boost a driving voltage to generate a virtual voltage, and a plurality of driving units configured to drive the wordlines, respectively. Each driving unit includes a driving signal generator and a wordline driver. The driving signal generator generates a driving signal based on the virtual voltage such that the driving signal having a voltage level is reinforced as compared with a voltage level of the driving voltage. The wordline driver drives each of the wordlines based on the driving voltage and the driving signal.

For example, the driving signal generator may be configured to generate a boosted driving signal from supply of the virtual voltage (e.g., application of the virtual voltage to a power supply terminal or ground terminal of the driving signal generator). The boosted driving signal may have a voltage that is boosted as compared with a voltage level of a driving signal that is generated when the driving signal generator is supplied with the driving voltage (e.g., application of the driving voltage to the power supply terminal or the ground terminal of driving signal generator). The wordline driver may drive each of the wordlines based on the driving voltage and the boosted driving signal.

The virtual power supplier may include conductors capacitively-coupled to each other to generate the virtual voltage.

The conductors may include metal lines that extend along a column direction of the memory cell array.

The virtual power supplier may include a virtual voltage line that extends along a column direction of the memory cell array to provide the virtual voltage, a boosting line that extends in a direction parallel to the virtual voltage line to be capacitively-coupled to the virtual voltage line, a switch coupled between the virtual voltage line and at least one of a ground voltage and a power supply voltage and configured to control a floating timing of the virtual voltage line, and a boosting driver configured to provide a power to the boosting line.

The boosting line may include a plurality of lines centered on the virtual voltage line. For example, the plurality of lines may be adjacent the virtual voltage line. For example, at least one of the lines may be adjacent to the left of the virtual voltage line and at least of the lines may be adjacent to the right of the virtual voltage line.

A plurality of ground voltage lines may be formed to surround the virtual voltage line and the boosting line for electric shielding of the virtual power supplier. For example, one of the ground voltage lines may be located left adjacently a boosting line that is to the left of the virtual voltage line and another one of the ground voltage lines may be located right adjacently a boosting line that is to the right of the virtual voltage line.

A semiconductor device according to an exemplary embodiment of the inventive concept includes a first internal power line configured to provide a driving voltage, a second internal power line configured to provide a gate voltage, a plurality of driving signal generators configured to generate a plurality of driving signals based on the gate voltage, and a plurality of load drivers configured to drive a plurality of loads based on the driving voltage and the driving signals.

The first internal power line may be connected to a first node of an external power line, and the second internal power line may be connected to a second node of the external power line, the second node being different from the first node.

A cross-sectional area of the first internal power line may be greater than a cross-sectional area of the second internal power line so that a resistance of the first internal power line may be less than a resistance of the second internal power line. For example, a width of the first internal power line may be greater than a width of the second internal power line.

The semiconductor device may be a semiconductor memory device. The plurality of load drivers may be a plurality of wordline drivers configured to drive a plurality of wordlines, respectively. The plurality of load drivers may be a plurality of bitline drivers configured to drive a plurality of bitlines, respectively. The plurality of load drivers may be a plurality of decoder drivers configured to drive a plurality of address lines, respectively. Alternately, the plurality of load drivers may be a plurality of output drivers configured to drive a plurality of output lines, respectively.

A semiconductor device according to an exemplary embodiment of the inventive concept includes a dummy power diode, a dummy retention circuit, a plurality of power diodes and a plurality of retention circuits. The dummy power diode is coupled between a power supply voltage line and a gate voltage line, and a gate of the dummy power diode is coupled to the gate voltage line. The dummy retention circuit is coupled between the gate voltage line and a ground voltage line. The plurality of power diodes are coupled in parallel between the power supply voltage line and a virtual power supply voltage line, and gates of the power diodes are coupled to the gate voltage line. The plurality of retention circuits are coupled in parallel between the virtual power supply voltage line and the ground voltage line.

A resistance of the dummy retention circuit may be less than a resistance of the retention circuit. The dummy retention circuit may include a plurality of dummy circuits coupled in parallel between the gate voltage line and the ground voltage line, each dummy circuit having same configuration as the retention circuit. The dummy retention circuit and the retention circuits may be formed through same manufacturing process to have same operational characteristics.

The semiconductor device may further include a power switch coupled between the power supply voltage line and the virtual power supply voltage line.

The retention circuit may include a plurality of static random access memory (SRAM) cells coupled between bitline pairs.

BRIEF DESCRIPTION OF THE DRAWINGS

Exemplary embodiments of the inventive concept will be more clearly understood from the following detailed description taken in conjunction with the accompanying drawings.

DETAILED DESCRIPTION

Figure 1:
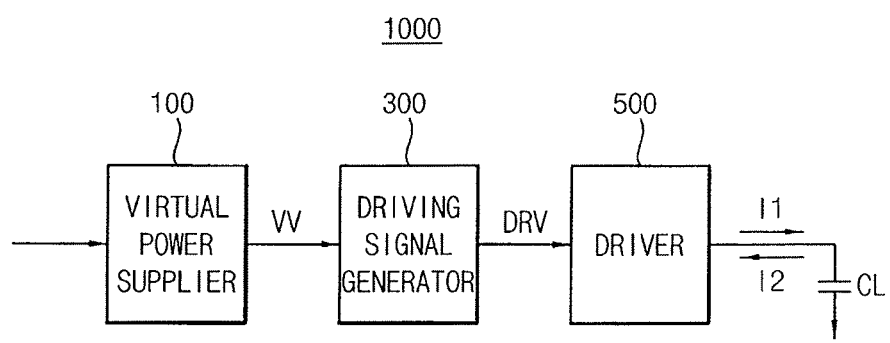
FIG. 1 is a block diagram illustrating a semiconductor device according to an exemplary embodiment of the inventive concept.

The inventive concept will be described more fully hereinafter with reference to the accompanying drawings, in which some exemplary embodiments thereof are shown. The present inventive concept may, however, be embodied in many different forms and should not be construed as limited to the exemplary embodiments set forth herein. In the drawings, the sizes and relative sizes of layers and regions may be exaggerated for clarity. Like numerals refer to like elements throughout.

It will be understood that when an element is referred to as being "connected" or "coupled" to another element, it can be directly connected or coupled to the other element or intervening elements may be present.

FIG. 1 is a block diagram illustrating a semiconductor device according to an exemplary embodiment of the inventive concept.

Referring to FIG. 1, a semiconductor device 1000 includes a virtual power supplier 100, a driving signal generator 300 and a load driver 500.

The virtual power supplier 100 boosts a driving voltage (e.g., a supply voltage or a ground voltage) to generate a virtual voltage VV. Boosting a voltage means that the voltage is either increased or decreased in value. The driving signal generator 300 generates a driving signal DRV based on the virtual voltage VV such that the driving signal DRV has a voltage level that is reinforced as compared with a voltage level of the driving voltage. For example, the driving signal generator 300 may generate a boosted driving signal based on being powered by the virtual voltage VV. For example, if the driving signal generator 300 had been powered by the driving voltage, instead of the virtual voltage VV, it would have generated a driving signal. The boosted driving signal is lower than the driving signal when the driving voltage is boosted downward and the boosted driving signal is higher than the driving voltage when the driving voltage is boosted upward. For example, the driving voltage may be boosted downward when the driving voltage is a ground voltage and the driving voltage may be boosted upward when the driving voltage is a power supply voltage. When the driving signal generator is powered by the virtual voltage VV, its ground terminal and/or a power supply terminal may receive a voltage of the virtual voltage VV.

The load driver 500 drives a load CL based on the driving voltage and the driving signal DRV. The load driver 500 drives the load CL in response to the driving signal DRV by causing a sourcing current I1 to charge the load CL or by causing a sinking current I2 to discharge away from the load CL. When the load CL is a high-capacitive load, a relatively long time is required for driving the load CL, thereby degrading an operating speed of the semiconductor device 1000. It may be difficult to reduce a capacitance of the load CL since it depends on the layout of the semiconductor device 1000, and thus the load driver 500 may be required to increase the driving currents I1 and I2.

The size of the load driver 500 may be increased to increase the driving currents I1 and I2. However, when the size of the load driver 500 is increased, the capacitance of the load driver 500 increases also, which may adversely affect enhancement of the operating speed. Alternately, several load drivers 500 may be used to increase the driving currents I1 and I2. However, use of several load drivers 500 may increase the size of a semiconductor device to an undesirable size.

In an alternate example, the driving voltage itself may be increased or the voltage level of the driving signal DRV may be reinforced using a level shifter to increase the driving currents I1 and I2. However in this example, additional components such as a charge pump are required to generate a high voltage and/or a negative voltage based on a power supply voltage, which may increase production costs and the size of the semiconductor device.

According to an exemplary embodiment of the inventive concept, the semiconductor device 1000 boosts the driving voltage to generate the virtual voltage VV without using additional components such as a charge pump, a level shifter, etc., and reinforces the voltage level of the driving signal DRV.

As will be described below, the virtual power supplier 100 may includes conductors capacitively-coupled to each other to generate the virtual voltage VV. The driving voltage may include a ground voltage VSS and a power supply voltage VDD, and the virtual power supplier 100 may boost at least one of the ground voltage VSS and the power supply voltage VDD to generate at least one of a virtual ground voltage VVSS and a virtual power supply voltage VVDD having reinforced voltage levels as compared with the driving voltages VSS and VDD. In other words, the virtual ground voltage VVSS may have a voltage level lower than a voltage level of the ground voltage VSS and the virtual power supply voltage may have a voltage level higher than a voltage level of the power supply voltage VDD.

Semiconductor devices for generating the virtual ground voltage VVSS having the reinforced voltage level as compared with the ground voltage VSS are described below with reference to FIGS. 2, 3 and 4.

Figure 2:
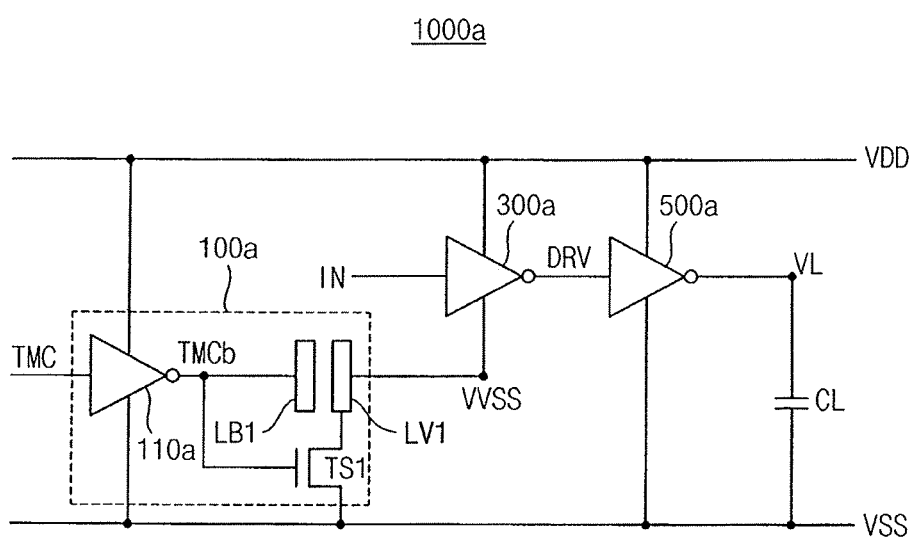
FIG. 2 is a circuit diagram illustrating a semiconductor device according to an exemplary embodiment of the inventive concept.

FIG. 2 is a circuit diagram illustrating a semiconductor device according to an exemplary embodiment of the inventive concept.

Referring to FIG. 2, a semiconductor device 1000*a* includes a virtual power supplier 100*a*, a driving signal generator 300*a* and a load driver 500*a*.

The virtual power supplier 100*a* boosts a ground voltage VSS to generate a virtual ground voltage VVSS. The driving signal generator 300*a* generates a driving signal DRV based on the virtual ground voltage VVSS such that the driving signal DRV has a voltage level that is reinforced as compared with a voltage level of the ground voltage VSS. The load driver 500*a* drives a load CL based on a driving voltage and the driving signal DRV. The driving voltage may include the ground voltage VSS and a power supply voltage VDD. For example, a ground terminal of the load driver 500*a* may receive the ground voltage VSS and a power supply terminal of the load driver 500*a* may receive the power supply voltage VDD.

The virtual power supplier 100*a* may include a virtual voltage conductor LV1, a boosting conductor LB1, a switch TS1 and a boosting driver 110*a*. The boosting conductor LB1 and the virtual voltage conductor LV1 are capacitively-coupled to each other, and the virtual ground voltage VVSS is provided from the virtual voltage conductor LV1. The switch TS1 is coupled between the virtual voltage conductor LV1 and the ground voltage VSS and controls a floating timing of the virtual voltage conductor LV1. The boosting driver 110*a* provides power to the boosting conductor LB1.

The floating timing and the boosting timing of the virtual voltage conductor LV1 may be controlled in response to a timing control signal TMC and the transition timing of the driving signal DRV may be controlled in response to an input signal IN. The timing control signal TMC and the input signal IN may be synchronized by a predetermined time interval. For example, the timing control signal TMC may be an internal clock signal ICK, which will be described below with reference to FIG. 9. The input signal IN may be synchronized with the internal clock signal ICK.

The boosting driver 110*a* may be implemented with an inverter configured to invert the timing control signal TMC to generate an inverted timing control signal TMCb. The boosting driver 110*a* may operate based on the ground voltage VSS and the power supply voltage VDD. The switch TS1 may be implemented with an N-type metal-oxide-semiconductor (NMOS) transistor having a gate electrode receiving the inverted timing control signal TMCb.

Figure 3:
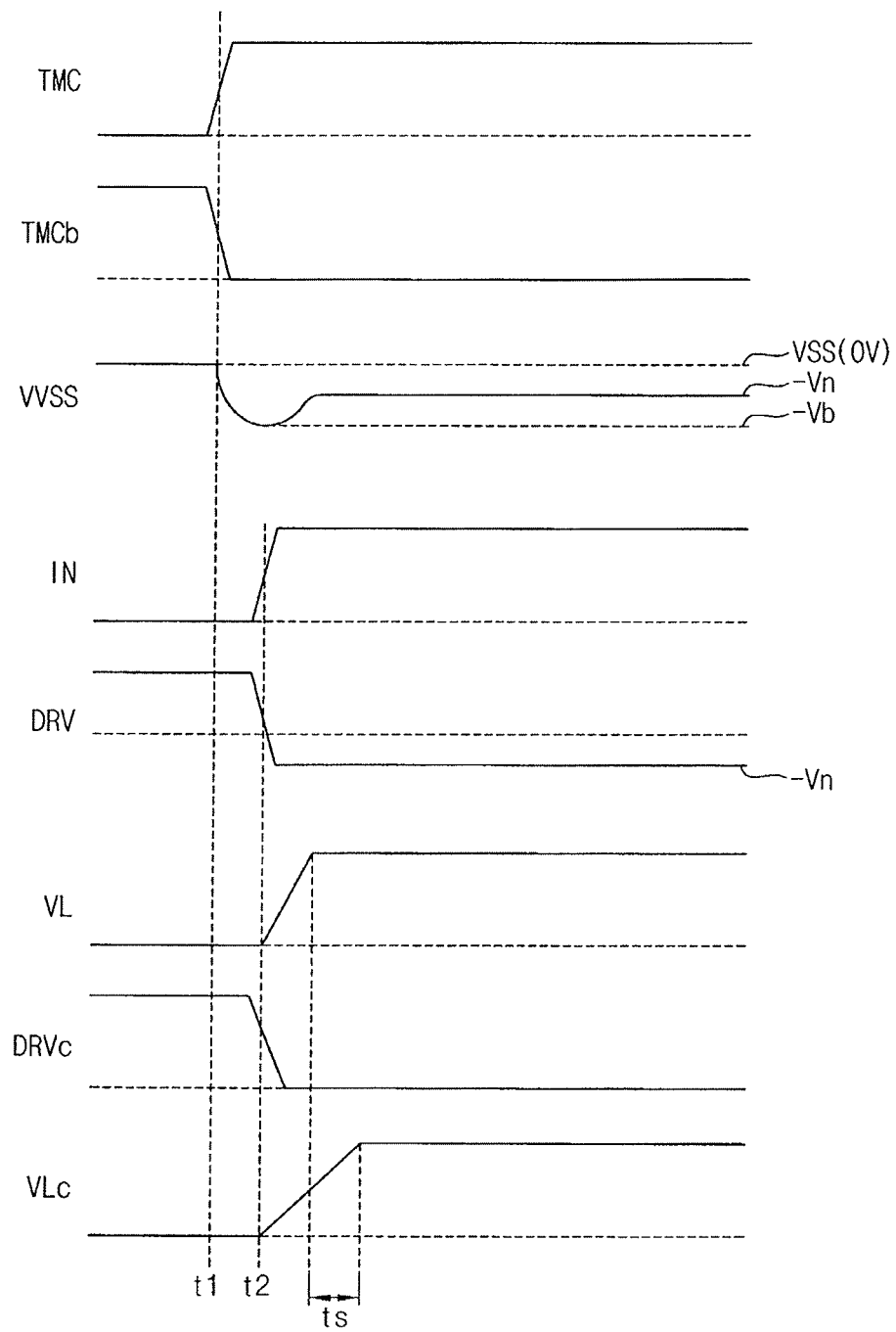
FIG. 3 is a diagram illustrating an exemplary operation of the semiconductor device of FIG. 2.

FIG. 3 is a diagram illustrating an exemplary operation of the semiconductor device of FIG. 2.

Referring to FIGS. 2 and 3, while the timing control signal TMC has a logic low level (or while the inverted timing control signal TMCb from the boosting driver 110*a* has a logic high level), the boosting conductor LB1 maintains a charged state at the power supply voltage VDD, the switch TS1 is turned on and the virtual voltage conductor LV1 maintains a discharged state at the ground voltage VSS.

When the timing control signal TMC transitions from the logic low level to the logic high level at time t1, the switch TS1 is turned off to float the virtual voltage conductor LV1 at the ground voltage VSS. Also the boosting conductor LB1 is discharged from the power supply voltage VDD to the ground voltage VSS (e.g., 0V) and thus the virtual ground voltage VVSS is boosted to a first voltage level −Vb lower than the voltage level of the ground voltage VSS since the virtual voltage conductor LV1 is capacitively-coupled to the boosting conductor LB1.

When the input signal IN transitions from the logic low level to the logic high level at time t2, the driving signal DRV from the driving signal generator 300*a* transitions from the logic high level to the logic low level. At this time, the voltage level of the driving signal DRV is reinforced to a second voltage level −Vn lower than the voltage level of the ground voltage VSS (e.g., 0V) since the driving signal generator 300*a* operates based on the virtual ground voltage VVSS that is boosted to the first voltage level −Vb. When the driving signal DRV transitions to the logic low level, the load driver 500*a* charges the load CL and a load voltage VL is enabled to the power supply voltage VDD.

A driving signal DRVc and a load voltage VLc, in which a driving signal generator operates based on the ground voltage VSS instead of the virtual ground voltage VVSS, are illustrated at the bottom portion of FIG. 3. As compared with the driving signal DRV having the reinforced voltage level −Vb through −Vn lower than the ground voltage VSS, the driving signal DRVc has the voltage level of the ground voltage VSS (e.g., 0V). The driving current of a pull-up transistor (e.g., a transistor PM3 in FIG. 10) included in the load driver 500*a* is increased as the driving signal applied to the gate of the pull-up transistor has a lower voltage level.

As a result, the load voltage VL according to an exemplary embodiment of the inventive may be enabled faster than the load voltage VLc by a time interval is as illustrated in FIG. 3, by using the driving signal DRV having the reinforced negative voltage level −Vb through −Vn.

Figure 4:
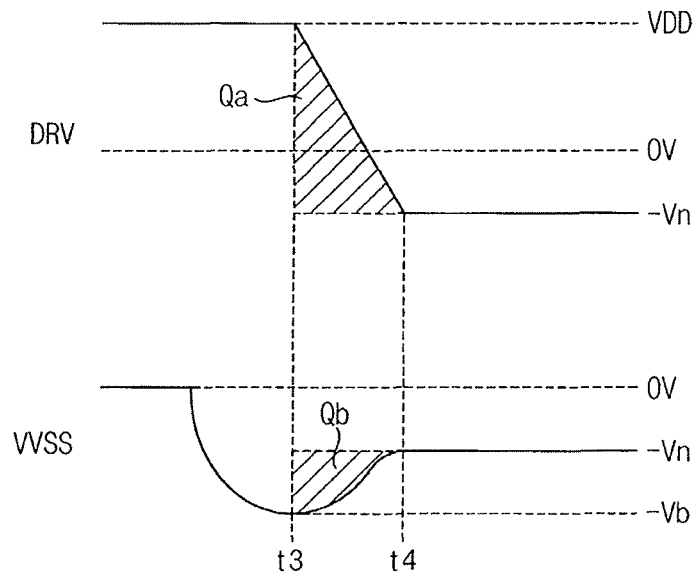
FIG. 4 is a diagram for describing a virtual voltage provided by the virtual power supplier in the semiconductor device of FIG. 2.

FIG. 4 is a diagram for describing a virtual voltage provided by the virtual power supplier in the semiconductor device of FIG. 2.

Referring to FIG. 4, when the input signal IN transitions from the logic low level to the logic high level while the virtual ground voltage VVSS is boosted to the first voltage level −Vb, a pull-down transistor in the driving signal generator 300*a* is turned on during the time interval t3 through t4, and thus charge sharing occurs between virtual voltage conductor LV1 and the output node of the driving signal generator 300*a*.

Assuming power loss due to a leakage current is disregarded, the amount of charge Qa that decreases from the output node of the driving signal generator 300a during the time interval t3 through t4 is substantially the same as the amount of charge Qb that increases at the virtual voltage conductor LV1 during the time interval t3 through t4. Thus the driving signal DRV and the virtual ground voltage VVSS are in equilibrium at the second voltage level −Vn. Accordingly the stabilized second voltage level −Vn of the driving signal DRV may be further reinforced as the boosted first voltage level −Vb is further lowered. The first voltage level −Vb may be lowered by increasing a coupling capacitance between the boosting conductor LB1 and the virtual voltage conductor LV1, which will be further described below with reference to FIG. 12.

As such, the semiconductor device 1000a according to at least one exemplary embodiment of the inventive concept may generate the virtual ground voltage VVSS, which is negatively boosted, using the capacitively-coupled conductors LB1 and LV1 without a charge pump and a level shifter, and thus the operating speed of the semiconductor device 1000a may be enhanced by reinforcing the voltage level of the driving signal DRV based on the boosted virtual ground voltage VVSS.

Semiconductor devices for generating the virtual power supply voltage VVDD having the reinforced voltage level as compared with the power supply voltage VDD are described below with reference to FIGS. 5 and 6.

Figure 5:
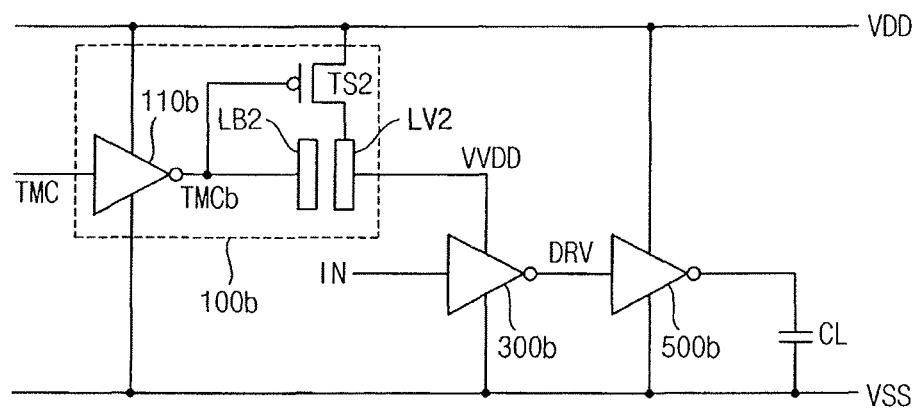
FIG. 5 is a circuit diagram illustrating a semiconductor device according to an exemplary embodiment of the inventive concept.

FIG. 5 is a circuit diagram illustrating a semiconductor device according to an exemplary embodiment of the inventive concept.

Referring to FIG. 5, a semiconductor device 1000b includes a virtual power supplier 100b, a driving signal generator 300b and a load driver 500b.

The virtual power supplier 100b boosts a power supply voltage VDD to generate a virtual power supply voltage VVDD. The driving signal generator 300b generates a driving signal DRV based on the virtual power supply voltage VVDD such that the driving signal DRV has a voltage level that is reinforced as compared with a voltage level of the power supply voltage VDD. The load driver 500b drives a load CL based on a driving voltage and the driving signal DRV. The driving voltage includes a ground voltage VSS and the power supply voltage VDD.

The virtual power supplier 100b may include a virtual voltage conductor LV2, a boosting conductor LB2, a switch TS2 and a boosting driver 110b. The boosting conductor LB2 and the virtual voltage conductor LV2 are capacitively-coupled to each other, and the virtual power supply voltage VVDD is provided from the virtual voltage conductor LV2. The switch TS2 is coupled between the virtual voltage conductor LV2 and the power supply voltage VDD and controls a floating timing of the virtual voltage conductor LV2. The boosting driver 110b provides power to the boosting conductor LB2.

The floating timing and the boosting timing of the virtual voltage conductor LV2 may be controlled in response to a timing control signal TMC and the transition timing of the driving signal DRV may be controlled in response to an input signal IN. The timing control signal TMC and the input signal IN may be synchronized by a predetermined time interval. For example, the timing control signal TMC may be an internal clock signal ICK, which will be described with reference to FIG. 9. The input signal IN may be synchronized with the internal clock signal ICK.

The boosting driver 110b may be implemented with an inverter configured to invert the timing control signal TMC to generate an inverted timing control signal TMCb. The boosting driver 110b may operate based on the ground voltage VSS and the power supply voltage VDD. The switch TS2 may be implemented with a P-type metal-oxide-semiconductor (PMOS) transistor having a gate electrode receiving the inverted timing control signal TMCb.

Figure 6:
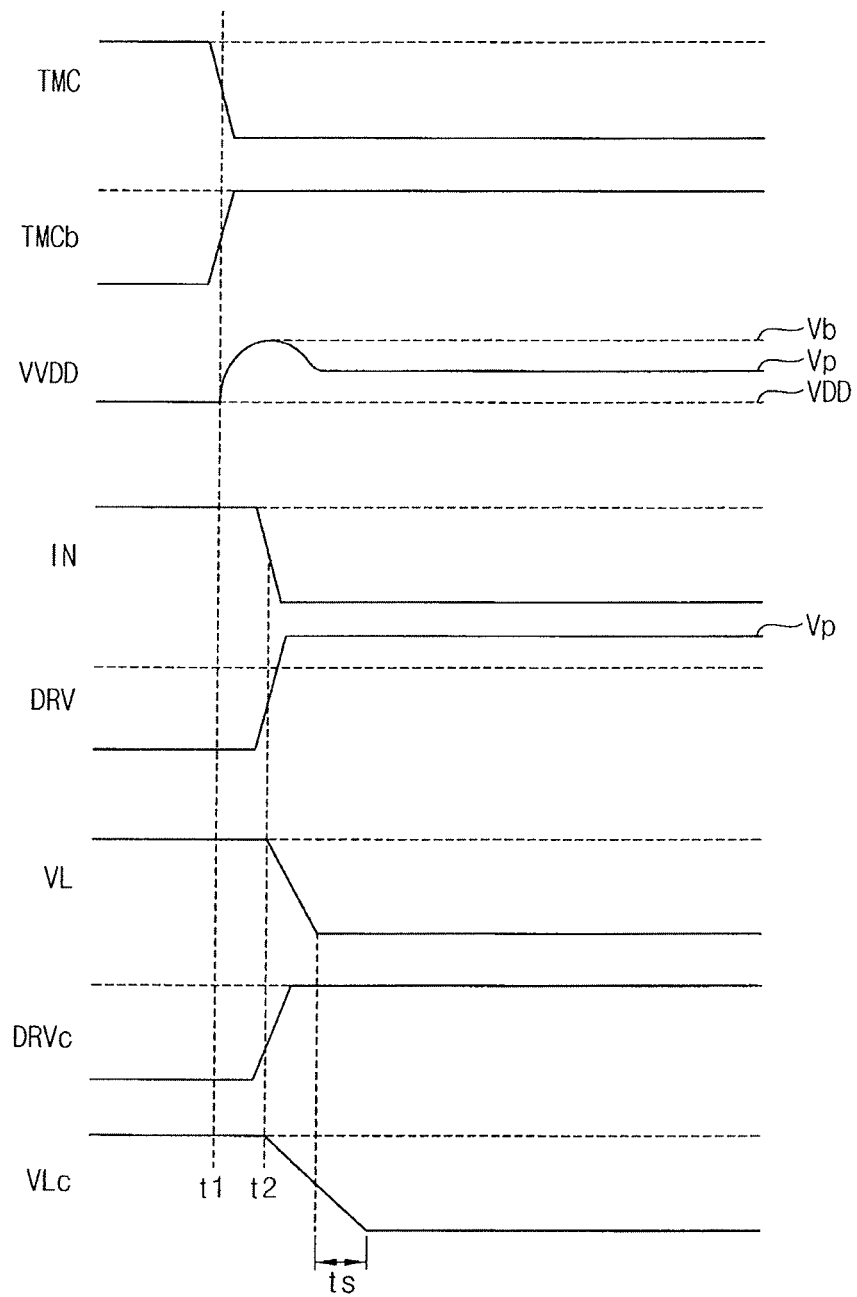
FIG. 6 is a diagram illustrating an exemplary operation of the semiconductor device of FIG. 5.

FIG. 6 is a diagram illustrating an exemplary operation of the semiconductor device of FIG. 5.

Referring to FIGS. 5 and 6, while the timing control signal TMC has a logic high level (or while the inverted timing control signal TMCb from the boosting driver 110b has a logic low level), the boosting conductor LB2 maintains a discharged state at the ground voltage VSS, the switch TS2 is turned on and the virtual voltage conductor LV2 maintains a charged state at the power supply voltage VDD.

When the timing control signal TMC transitions from the logic high level to the logic low level at time t1, the switch TS2 is turned off to float the virtual voltage conductor LV2 at the power supply voltage VDD and the boosting conductor LB2 is charged from the ground voltage VSS to the power supply voltage VDD. Thus the virtual power supply voltage VVDD is boosted to a first voltage level Vb higher than the power supply voltage VDD since the virtual voltage conductor LV2 is capacitively-coupled to the boosting conductor LB2.

When the input signal IN transitions from the logic high level to the logic low level at time t2, the driving signal DRV from the driving signal generator 300b transitions from the logic low level to the logic high level. At this time, the voltage level of the driving signal DRV is reinforced to a second voltage level Vp higher than the power supply voltage VDD since the driving signal generator 300b operates based on the virtual power supply voltage VVDD that is boosted to the first voltage level Vb. When the driving signal DRV transitions to the logic high level, the load driver 500b discharges the load CL and a load voltage VL is disabled to the ground voltage VSS.

A driving signal DRVc and a load voltage VLc, in which a driving signal generator operates based on the power supply voltage VDD instead of the virtual power supply voltage VVDD, are illustrated at the bottom portion of FIG. 6. As compared with the driving signal DRV having the reinforced voltage level Vp through Vb higher than the power supply voltage VDD, the driving signal DRVc has the voltage level of the power supply voltage VDD. The driving current of a pull-down transistor (e.g., a transistor NM3 in FIG. 10) included in the load driver 500b is increased as the driving signal applied to the gate of the pull-down transistor has a higher voltage level.

As a result, the load voltage VL according to an exemplary embodiment of the inventive concept may be disabled faster than the load voltage VLc by a time interval is as illustrated in FIG. 6, by using the driving signal DRV having the reinforced negative voltage level Vp through Vb.

As such, the semiconductor device 1000b according to an exemplary embodiment of the inventive concept may generate the virtual power supply voltage VVDD, which is positively boosted, using the capacitively-coupled conductors LB2 and LV2 without a charge pump and a level shifter, and thus the operating speed of the semiconductor device 1000b may be enhanced by reinforcing the voltage level of the driving signal DRV based on the boosted virtual power supply voltage VVDD.

Semiconductor devices for generating both of the virtual ground voltage VVSS and the virtual power supply voltage VVDD are described below with reference to FIGS. 7 and 8.

Figure 7:
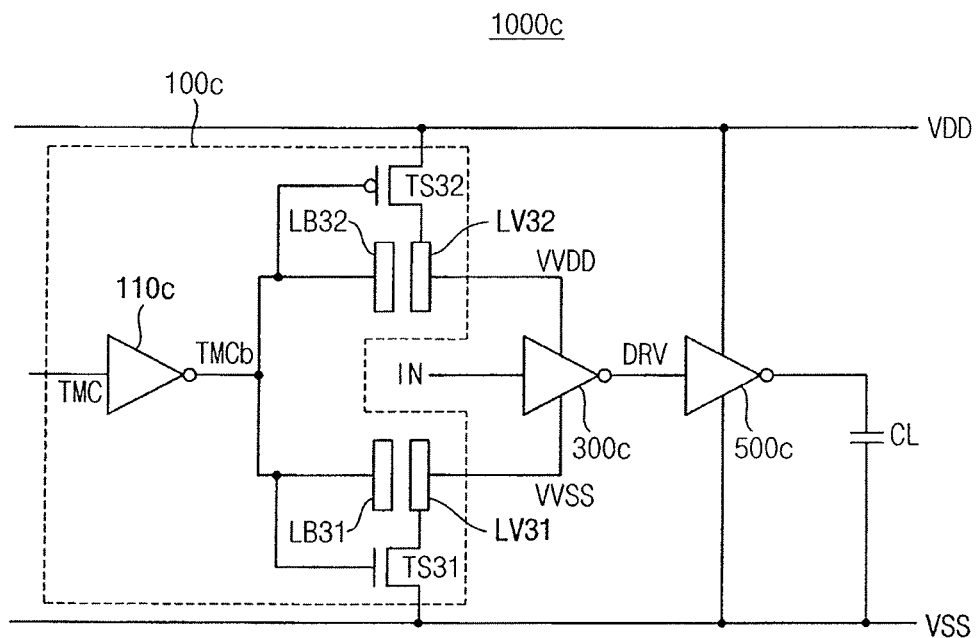
FIGS. 7 and 8 are circuit diagrams illustrating semiconductor devices according to exemplary embodiments of the inventive concept.
Figure 8:
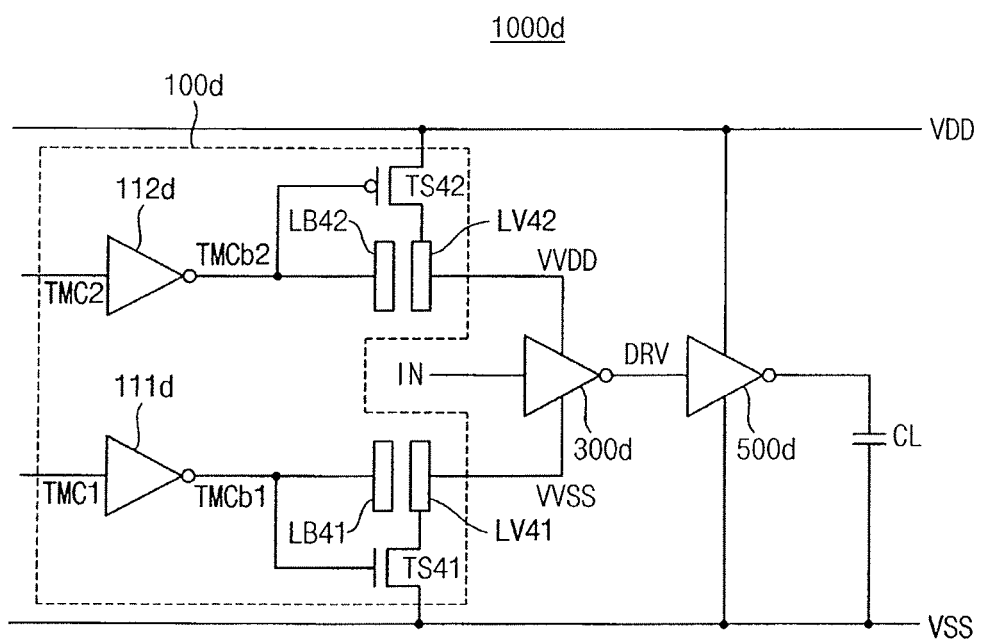

FIGS. 7 and 8 are circuit diagrams illustrating semiconductor devices according to exemplary embodiments of the inventive concept.

Referring to FIG. 7, a semiconductor device 1000*c* includes a virtual power supplier 100*c*, a driving signal generator 300*c* and a load driver 500*c*.

The virtual power supplier 100*c* boosts a ground voltage VSS to generate a virtual ground voltage VVSS and boosts a power supply voltage VDD to generate a virtual power supply voltage VVDD. The driving signal generator 300*c* generates a driving signal DRV based on the virtual ground voltage VVSS and the virtual power supply voltage VVDD such that the driving signal DRV has voltage levels that are reinforced as compared with the ground voltage VSS and the power supply voltage VDD. The load driver 500*c* drives a load CL based on a driving voltage and the driving signal DRV. The driving voltage includes the ground voltage VSS and the power supply voltage VDD.

The virtual power supplier 100*c* may include a first virtual voltage conductor LV31, a second virtual voltage conductor LV32, a first boosting conductor LB31, a second boosting conductor LB32, a first switch TS31, a second switch TS32 and a boosting driver 110*c*. The first boosting conductor LB31 and the first virtual voltage conductor LV31 are capacitively-coupled to each other, and the virtual ground voltage VVSS is provided from the first virtual voltage conductor LV31. The second boosting conductor LB32 and the second virtual voltage conductor LV32 are capacitively-coupled to each other, and the virtual power supply voltage VVDD is provided from the second virtual voltage conductor LV32. The first switch TS31 is coupled between the first virtual voltage conductor LV31 and the ground voltage VSS and controls a floating timing of the first virtual voltage conductor LV31. The second switch TS32 is coupled between the second virtual voltage conductor LV32 and the power supply voltage VDD and controls a floating timing of the second virtual voltage conductor LV32. The boosting driver 110*c* provides power to the first boosting conductor LB31 and the second boosting conductor LB32.

The floating timing and the boosting timing of the virtual voltage conductors LV31 and LV32 may be controlled in response to a timing control signal TMC and the transition timing of the driving signal DRV may be controlled in response to an input signal IN. The timing control signal TMC and the input signal IN may be synchronized by a predetermined time interval. For example, the timing control signal TMC may be an internal clock signal ICK, which will be described below with reference to FIG. 9. The input signal IN may be synchronized with the internal clock signal ICK.

The semiconductor device 1000*c* according to exemplary embodiments of the inventive concept may generate the virtual ground voltage VVSS and the virtual power supply voltage VVDD, which are boosted, using the capacitively-coupled first conductors LB31 and LV31 and the capacitively-coupled second conductors LB32 and LV32 without a charge pump and a level shifter, and thus the operating speed of the semiconductor device 1000*c* may be enhanced by reinforcing the voltage level of the driving signal DRV based on the boosted virtual ground voltage VVSS and the boosted virtual power supply voltage VVDD.

Referring to FIG. 8, a semiconductor device 1000*d* includes a virtual power supplier 100*d*, a driving signal generator 300*d* and a load driver 500*d*.

The virtual power supplier 100*d* boosts a ground voltage VSS to generate a virtual ground voltage VVSS and boosts a power supply voltage VDD to generate a virtual power supply voltage VVDD. The driving signal generator 300*d* generates a driving signal DRV based on the virtual ground voltage VVSS and the virtual power supply voltage VVDD such that the driving signal DRV has voltage levels that are reinforced as compared with the ground voltage VSS and the power supply voltage VDD. The load driver 500*d* drives a load CL based on the driving voltage and the driving signal DRV. The driving voltage includes the ground voltage VSS and the power supply voltage VDD.

The virtual power supplier 100*d* may include a first virtual voltage conductor LV41, a second virtual voltage conductor LV42, a first boosting conductor LB41, a second boosting conductor LB42, a first switch TS41, a second switch TS42, a first boosting driver 111*d* and a second boosting driver 112*d*. The first boosting conductor LB41 and the first virtual voltage conductor LV41 are capacitively-coupled to each other, and the virtual ground voltage VVSS is provided from the first virtual voltage conductor LV41. The second boosting conductor LB42 and the second virtual voltage conductor LV42 are capacitively-coupled to each other, and the virtual power supply voltage VVDD is provided from the second virtual voltage conductor LV42. The first switch TS41 is coupled between the first virtual voltage conductor LV41 and the ground voltage VSS and controls a floating timing of the first virtual voltage conductor LV41. The second switch TS42 is coupled between the second virtual voltage conductor LV42 and the power supply voltage VDD and controls a floating timing of the second virtual voltage conductor LV42. The first boosting driver 111*d* provides power to the first boosting conductor LB41 and the second boosting driver 112*d* provides power to the second boosting conductor LB42.

Whereas the floating and boosting timings of the first and second virtual voltage conductors LV31 and LV32 are controlled based on the common timing control signal TMC in the exemplary embodiment of FIG. 7, the floating and boosting timing of the first virtual voltage conductor LV41 is controlled based on a first timing control signal TMC1, and the floating and boosting timing of the second virtual voltage conductor LV42 is controlled based on a second timing control signal TMC2 different from the first timing control signal TMC1. In this embodiment, a rising-edge of the input signal IN may be synchronized with a rising-edge of the first timing control signal TMC1 and a falling-edge of the input signal IN may be synchronized with a falling-edge of the second timing control signal TMC2. For example, the input signal IN and the first timing control signal TMC1 may be generated such that their rising and falling edges coincide with one another. Accordingly the operating speed of the semiconductor 1000*d* may be enhanced by controlling the charging timing and the discharging timing independently depending on the different timing control signals TMC1 and TMC2.

The semiconductor device 1000*d* according to exemplary embodiments of the inventive concept may generate the virtual ground voltage VVSS and the virtual power supply voltage VVDD, which are boosted, using the capacitively-coupled first conductors LB31 and LV31 and the capacitively-coupled second conductors LB32 and LV32 without a charge pump and a level shifter, and thus the operating speed of the semiconductor device 1000*d* may be further enhanced by reinforcing the voltage level of the driving signal DRV based on the boosted virtual ground voltage VVSS and the boosted virtual power supply voltage VVDD.

Figure 9:
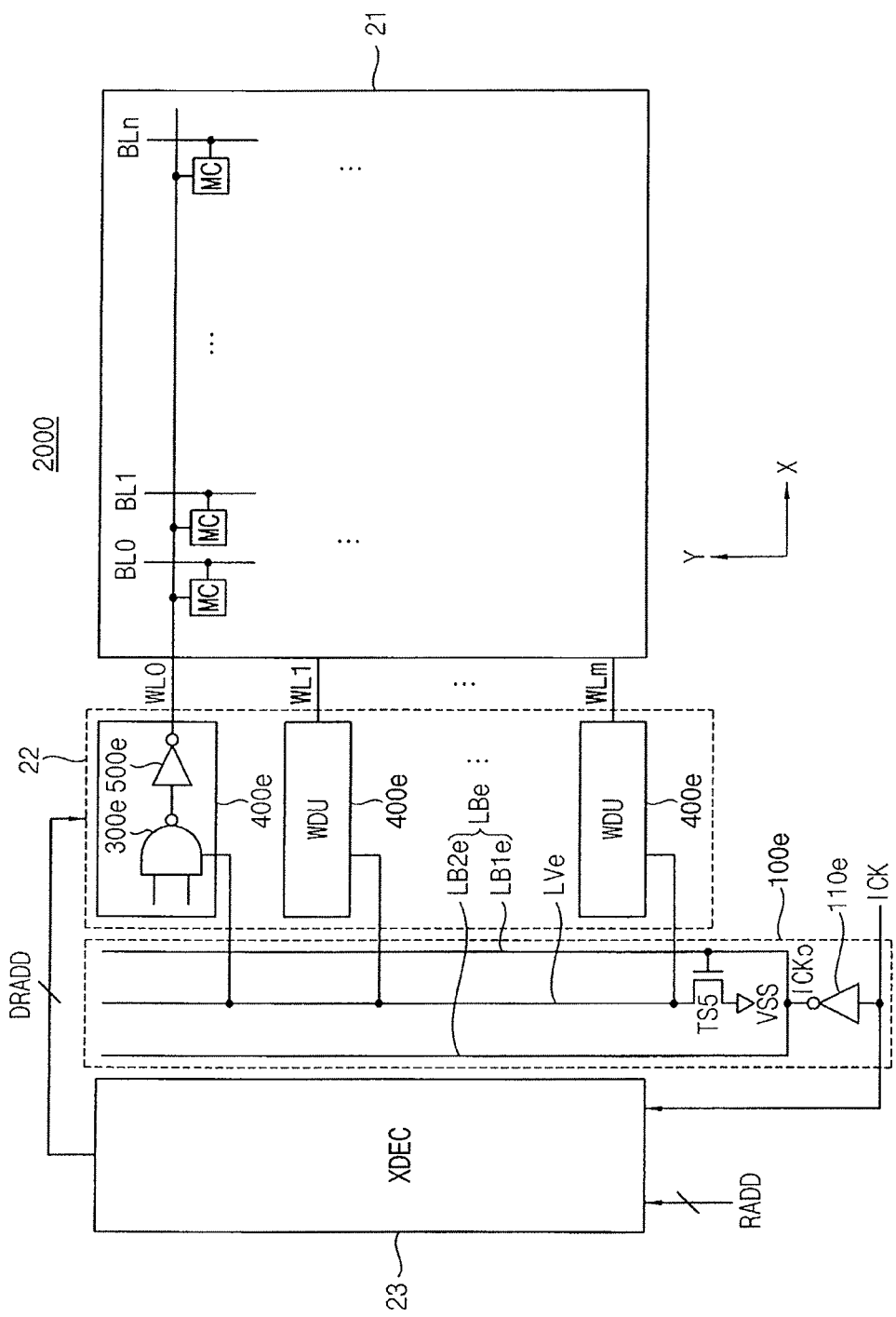
FIG. 9 is a diagram illustrating a semiconductor memory device according to an exemplary embodiment of the inventive concept.

FIG. 9 is a diagram illustrating a semiconductor memory device according to an exemplary embodiment of the inventive concept.

Referring to FIG. 9, a semiconductor memory device 2000 includes a memory cell array 21, a virtual power supplier 100*e* and a wordline driving circuit 22. The semiconductor memory device 2000 may further include peripheral circuits such as a row decoder XDEC 23.

The memory cell array 21 includes a plurality of memory cells MC coupled to a plurality of wordlines WLi (i=0, 1, ..., m) and a plurality of bitlines BLj (j=0, 1, ..., n). The semiconductor memory device 2000 may be a volatile memory device such as a dynamic random access memory (DRAM), a static random access memory (SRAM), etc. or a non-volatile memory device such as a flash memory, a resistive memory, etc. The memory cell MC may have various configurations depending on the memory type. The wordlines WLi may extend along a row direction X and the bitlines BLj may extend along a column direction Y.

The virtual power supplier 100e boosts a driving voltage to generate a virtual voltage. As described above, the driving voltage may include the ground voltage VSS and the power supply voltage VDD, and the virtual power supplier 100e may boost at least one of the ground voltage VSS and the power supply voltage VDD to generate at least one of a virtual ground voltage VVSS and a virtual power supply voltage VVDD having reinforced voltage levels as compared with the voltages VSS and VDD. FIG. 9 illustrates an exemplary embodiment in which the virtual power supplier 100e boosts the ground voltage VSS to generate the virtual ground voltage VVSS.

The virtual power supplier 100e may generate the virtual ground voltage VVSS using conductors capacitively-coupled to each other. As illustrated in FIG. 9, the conductors may include metal lines LVe, and LBe that extend along the column direction Y of the memory cell array 21.

In exemplary embodiments, the virtual power supplier 100e may include a virtual voltage line LVe, a boosting line LBe, a switch TS5 and a boosting driver 110e. The boosting line LBe may include a plurality of lines LB1e and LB2e, which will be further described with reference to FIG. 12. The virtual voltage line LVe may extend along the column direction Y of the memory cell array 21 to provide the virtual ground voltage VVSS. The boosting line LBe may extend in parallel to the virtual voltage line LVe to be capacitively-coupled to the virtual voltage line LVe. The switch TS5 may be coupled between the virtual voltage line LVe and the ground voltage VSS, and may control a floating timing of the virtual voltage line LVe. The boosting driver 110e provides a power to the boosting line LBe.

The wordline driving circuit 22 may include a plurality of driving units WDU 400e configured to drive the wordlines WLi, respectively. Each driving unit 400e may include a driving signal generator 300e and a wordline driver 500e. The driving signal generator 300e may generate a driving signal DRV based on the virtual ground voltage VVSS from the virtual power supplier 100e such that the driving signal DRV has a voltage level that is reinforced as compared with a voltage level of the ground voltage VSS. The wordline driver 500e may drive each wordline WLi based on the ground voltage VSS, the power supply voltage VDD and the driving signal DRV.

As described above, the floating timing and the boosting timing of the virtual voltage conductor LVe may be controlled in response to the timing control signal TMC and the transition timing of the driving signal DRV may be controlled in response to the input signal IN. As illustrated in FIG. 9, the timing control signal TMC may correspond to the internal clock signal ICK of the semiconductor memory device 2000 and the input signal IN may correspond to a decoded address signal DRADD provided from the row decoder 23. The row decoder 23 may decode a row address signal RADD to output the decoded address signal DRADD in synchronization with the internal clock signal ICK and thus the decoded address signal DRADD corresponding to the timing control signal TMC and the internal clock signal ICK corresponding to the input signal IN may be synchronized by a predetermined time interval.

It may be difficult to increase the operating speed of a wordline driving circuit to keep pace with a semiconductor memory device it is driving, which may result in a bottle-neck that blocks or reduces high-speed operation. The wordline driving circuit 22 has a configuration in which multiple bits of the decoded address signal DRADD are gated to enable one selected wordline. In such a configuration, the other unselected wordlines function as a high-capacitive parasitic load, which may cause significant delay in driving the selected wordline.

To improve the wordline driving speed, the virtual power supplier 100e generates the virtual ground voltage VVSS by boosting the ground voltage VSS to the negative voltage level, the driving signal generator 300e, which is disposed directly prior to the wordline driver 500e, generates the driving signal having the reinforced voltage level based on the boosted virtual ground voltage VVSS instead of the ground voltage VSS, and thus the wordline enable time may be reduced.

Figure 10:
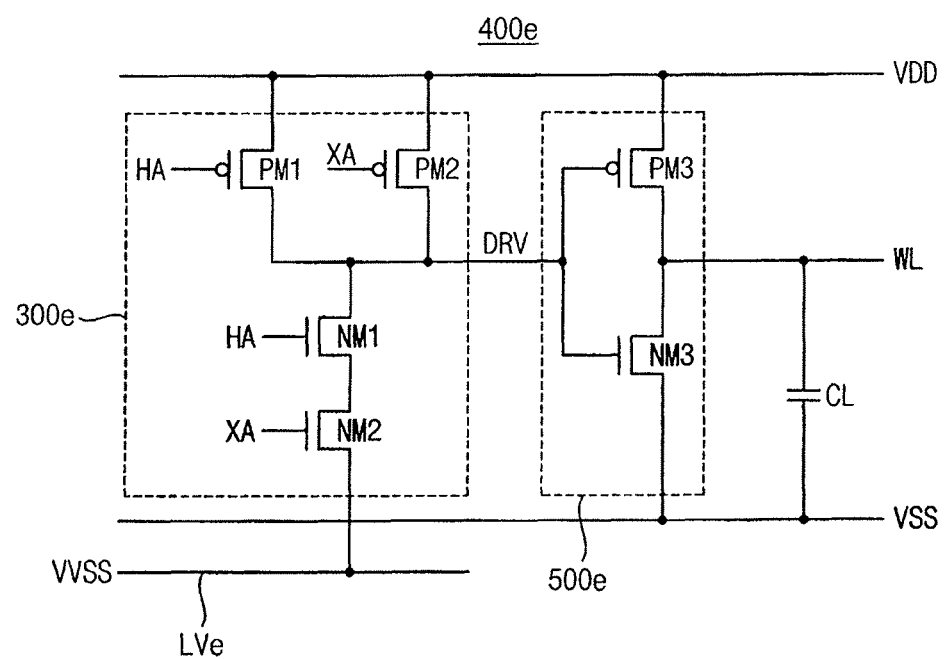
FIG. 10 is a circuit diagram illustrating an example of a wordline driving unit in the semiconductor memory device of FIG. 9.

FIG. 10 is a circuit diagram illustrating an example of a wordline driving unit in the semiconductor memory device of FIG. 9.

Referring to FIG. 10, each wordline driving unit 400e may include the driving signal generator 300e and the wordline driver 500e.

For example, the driving signal generator 300e may be implemented as a NAND gate including a first PMOS transistor PM1, a second PMOS transistor PM2, a first NMOS transistor NM1 and a second NMOS transistor NM2. The wordline driver 500e may be implemented as an inverter including a third PMOS transistor PM3 as a pull-up transistor and a third NMOS transistor NM3 as a pull-down transistor.

A first address bit signal HA may be input to gates of the first PMOS transistor PM1 and the first NMOS transistor NM1 and a second address bit signal XA may be input to gates of the second PMOS transistor PM2 and the second NMOS transistor NM2. Thus the driving signal generator may perform a NAND operation on the first address bit signal HA and the second address bit signal XA to generate the driving signal DRV.

While the row decoder 23 of FIG. 9 decodes the row address signal RADD and drives the second address bit signal XA from the logic low level to the logic high level in synchronization with the internal clock signal ICK, the inverted clock signal ICKb transitions from the logic high level to the logic low level and the boosting line LBe is discharged to the ground voltage VSS. At this time, the virtual voltage line LVe is boosted to the negative voltage level because the virtual voltage line LVe is floated and capacitively-coupled to the boosting line LBe.

The boosted virtual ground voltage VVSS of the virtual voltage line LVe as such may be used as a source voltage of the driving signal generator 300e that is disposed directly prior to the wordline driver 500e, and thus the voltage level of the driving signal DRV is reinforced to the negative voltage level. Using the reinforced driving signal DRV, the wordline may be enabled faster to the power supply voltage VDD.

As such, to drive a wordline corresponding to a high-capacitive load, the virtual ground voltage VVSS, which is used as one driving voltage by the driving signal generator 300e, may be boosted at the proper timing so that the wordline enable time may be reduced. The wordline enable time depends on the boosted voltage level −Vb of the virtual ground voltage VVSS, and the boosted voltage level −Vb depends on the coupling capacitance between the boosting line LBe and the virtual voltage line LVe.

Figure 11:
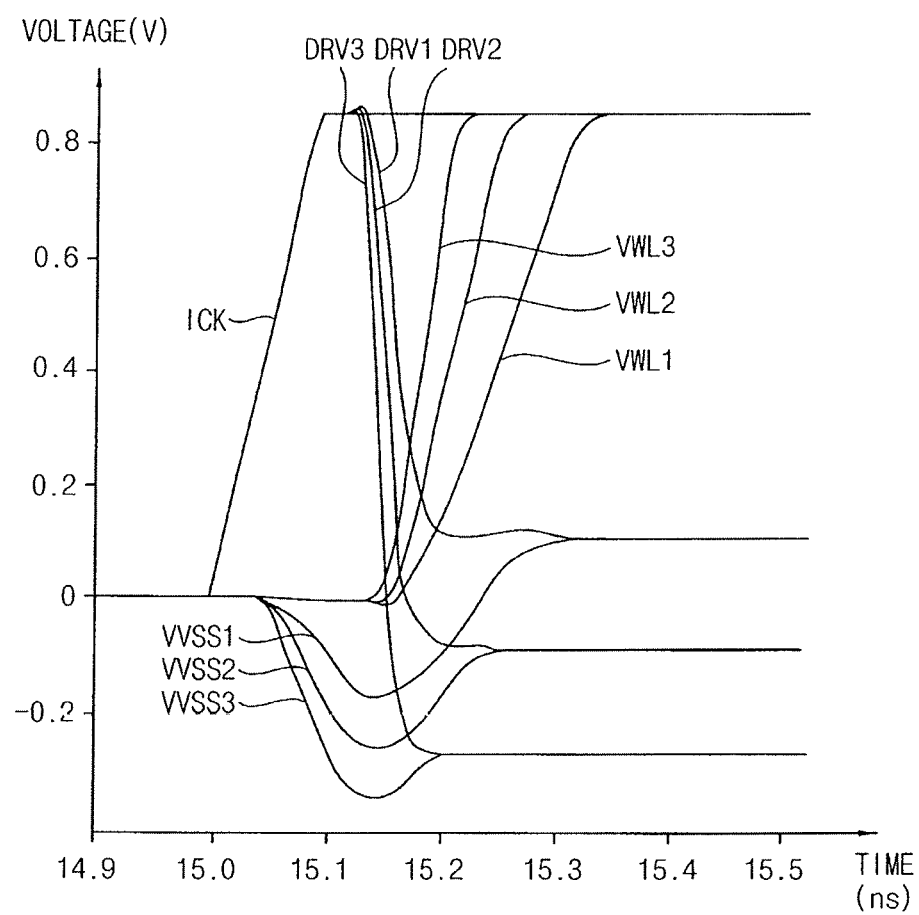
FIG. 11 is a diagram illustrating exemplary operational characteristics of the semiconductor memory device of FIG. 9.

FIG. 11 is a diagram illustrating exemplary operational characteristics of the semiconductor memory device of FIG. 9.

In FIG. 11, a first case is represented by an index 1 such as VVSS1, DRV1 and VWL1, a second case is represented by an index 2 such as VVSS2, DRV2 and VWL2, and a third case is represented by an index 3 such as VVSS3, DRV3 and VWL3 where VVSSi (i=1, 2, 3) indicates the virtual ground voltage, DRVi indicates the driving signal and VWLi indicates a wordline voltage. The first case corresponds to a case where the coupling capacitance between the boosting line LBE and the virtual voltage line LVE is smallest among the three cases, and the third case corresponds to a case where the coupling capacitance is largest among the three cases.

Referring to FIG. 11, as the coupling capacitance increases, the boosted voltage level of the virtual ground voltage VVSSi is lowered and the driving signal DRVi transitions relatively quickly to the logic low level. As a result, the time taken to enable the wordline voltage VWLi to the logic high level may decrease as the coupling capacitance between the boosting line LBe and the virtual voltage line LVe is increased.

Figure 12:
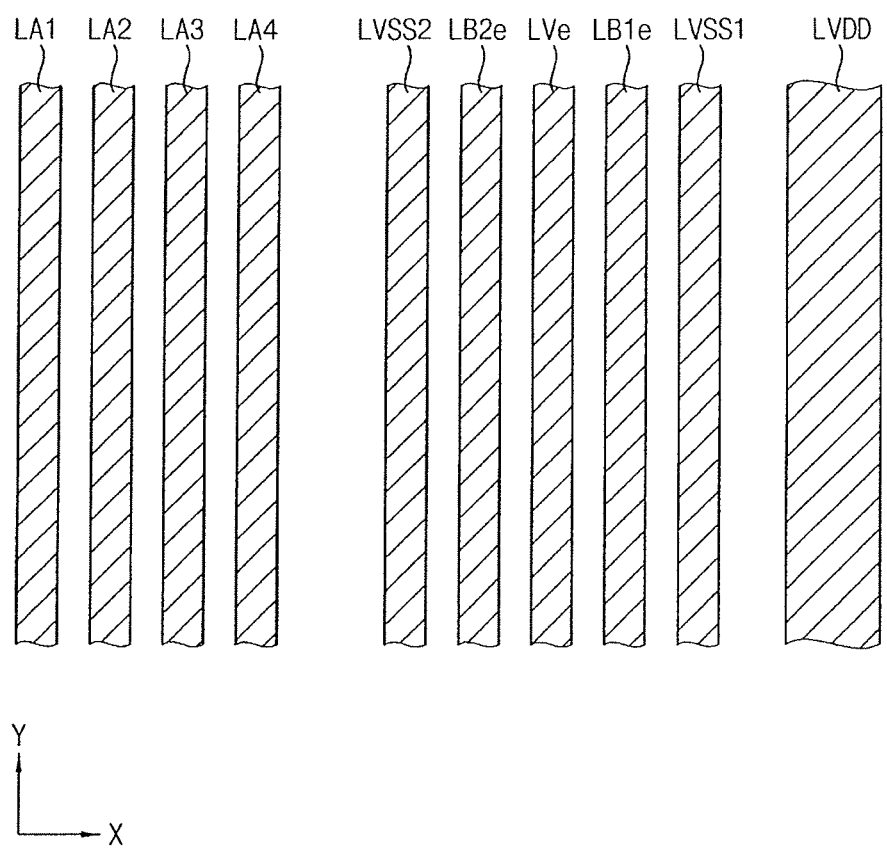
FIG. 12 is a diagram illustrating a wiring layout of a semiconductor device according to an exemplary embodiment of the inventive concept.

FIG. 12 is a diagram illustrating a wiring layout of a semiconductor device according to an exemplary embodiment of the inventive concept.

FIG. 12 illustrates an example of metal lines that may be formed in a metal layer over a semiconductor substrate. The metal lines may include address signal lines LA1, LA2, LA3 and LA4, a power supply voltage line LVDD, ground voltage lines LVSS1 and LVSS2, boosting lines LB1e and LB2e, and a virtual voltage line LVe.

To increase the coupling capacitance, the boosting lines LB1e and LB2e and the virtual voltage line LVe may extend along the column direction Y of the memory cell array in parallel with each other to be capacitively-coupled.

In an exemplary embodiment of the inventive concept, the boosting line may include a plurality of lines centered about the virtual voltage lin. For example, the boosting line LBe may include a first boosting line LB1e and a second boosting line LB2e that are disposed at both sides of the virtual voltage line LVe as illustrated in FIG. 12. In a further exemplary embodiment of the inventive concept, a plurality of ground voltage lines may be formed to surround the virtual voltage line and the boosting line for electric shielding of the virtual power supplier. For example, the ground voltage lines LVSS1 and LVSS2 may be disposed at both sides of the first and second boosting lines LB1e and LB2e for electric shielding of the virtual voltage line VLe and the boosting line VBe is included in the virtual power supplier. Such electric shielding may decrease parasitic capacitance between the boosting line LBe and adjacent elements, thereby increasing the coupling capacitance between the virtual voltage line VLe and the boosting line VBe.

Figure 13:
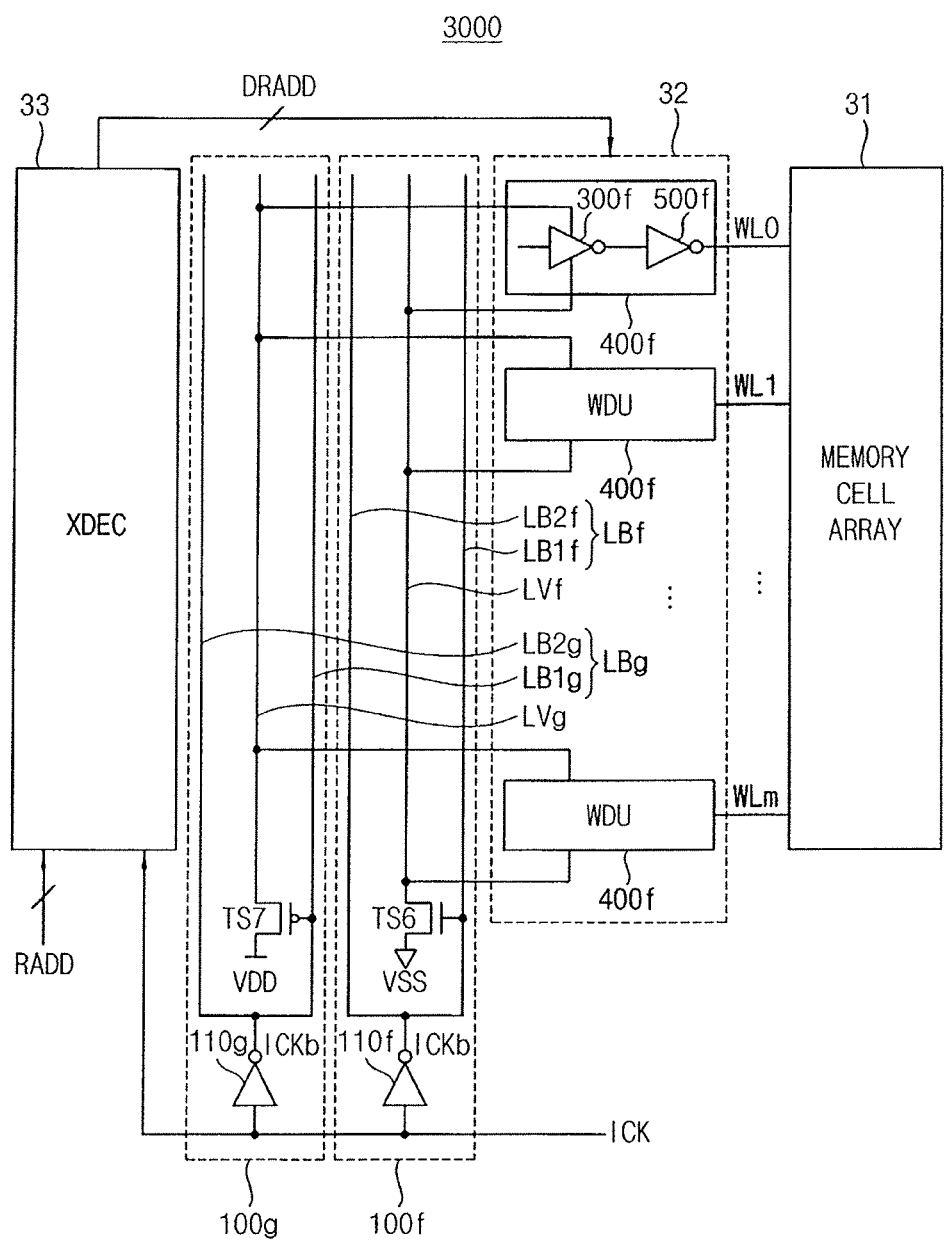
FIG. 13 is a diagram illustrating a semiconductor memory device according to an exemplary embodiment of the inventive concept.

FIG. 13 is a diagram illustrating a semiconductor memory device according to an exemplary embodiment of the inventive concept.

Referring to FIG. 13, a semiconductor memory device 3000 includes a memory cell array 31, a first virtual power supplier 100*f*, a second virtual power supplier 100*g* and a wordline driving circuit 32. The semiconductor memory device 3000 may further include peripheral circuits such as a row decoder XDEC 33.

As described with reference to FIG. 9, the memory cell array 31 includes a plurality of memory cells MC coupled to a plurality of wordlines WLi (i=0, 1, . . . , m) and a plurality of bitlines BLj (j=0, 1, . . . , n). The semiconductor memory device 3000 may be a volatile memory device such as a dynamic random access memory (DRAM), a static random access memory (SRAM), etc. or a non-volatile memory device such as a flash memory, a resistive memory, etc. The memory cell MC may have various configurations depending on the memory type. The wordlines WLi may extend along a row direction X and the bitlines BLj may extend along a column direction Y.

The first virtual power supplier 100*f* and the second virtual power supplier 100*g* boost a driving voltage to generate a virtual voltage. As described above, the driving voltage may include the ground voltage VSS and the power supply voltage VDD. The first virtual power supplier 100*f* may boost the ground voltage VSS to generate a virtual ground voltage VVSS having the reinforced voltage level as compared with the ground voltage VSS. The second virtual power supplier 100*g* may boost the power supply voltage VDD to generate a virtual power supply voltage VVDD having the reinforced voltage level as compared with the power supply voltage VDD. FIG. 13 illustrates an exemplary embodiment in which both of the ground voltage VSS and the power supply voltage VDD are boosted to generate the virtual ground voltage VVSS and the virtual power supply voltage VVDD.

The first and second virtual power suppliers 100*f* and 100*g* may generate the virtual ground voltage VVSS and the virtual power supply voltage VVDD using conductors capacitively-coupled to each other. As illustrated in FIG. 13, the conductors may include metal lines LVg, LVf, LBg and LBf that extend along the column direction of the memory cell array 31.

In exemplary embodiments of the inventive concept, the first virtual power supplier 100*f* may include a first virtual voltage line LVf, a first boosting line LBf, a first switch TS6 and a first boosting driver 110*f*, and the second virtual power supplier 100*g* may include a second virtual voltage line LVg, a second boosting line LBg, a second switch TS7 and a second boosting driver 110*g*. As described with reference to FIG. 12, the first boosting line LBf may include the two branch lines LB1*f* and LB2*f* to increase the coupling capacitance with the first virtual voltage line LVf, and the second boosting line LBg may include the two branch lines LB1*g* and LB2*g* to increase the coupling capacitance with the second virtual voltage line LVg.

The first virtual voltage line LVf may extend along the column direction of the memory cell array 31 to provide the virtual ground voltage VVSS. The first boosting line LBf may extend in parallel to the first virtual voltage line LVf to be capacitively-coupled to the first virtual voltage line LVf. The first switch TS6 may be coupled between the first virtual voltage line LVf and the ground voltage VSS, and may control a floating timing of the first virtual voltage line LVf. The first boosting driver 110*f* provides power to the first boosting line LBf.

The second virtual voltage line LVg may extend along the column direction of the memory cell array 31 to provide the virtual power supply voltage VVDD. The second boosting line LBg may extend in parallel to the second virtual voltage line LVg to be capacitively-coupled to the second virtual voltage line LVg. The second switch TS7 may be coupled between the second virtual voltage line LVg and the power supply voltage VDD, and may control a floating timing of the second virtual voltage line LVg. The second boosting driver 110*g* provides a power to the second boosting line LBg.

The wordline driving circuit 32 may include a plurality of driving units WDU 400*f* configured to drive the wordlines WLi, respectively. Each driving unit 400f may include a driving signal generator 300f and a wordline driver 500f. The driving signal generator 300f may generate a driving signal DRV based on the virtual ground voltage VVSS from the first virtual power supplier 100f and the virtual power supply voltage VVDD from the second virtual power supplier 100g such that the driving signal DRV has a low voltage level that is reinforced as compared with a voltage level of the ground voltage VSS and a high voltage level that is reinforced as compared with a voltage level of the power supply voltage VDD. The wordline driver 500f may drive each wordline WLi based on the ground voltage VSS, the power supply voltage VDD and the driving signal DRV.

Figure 14:
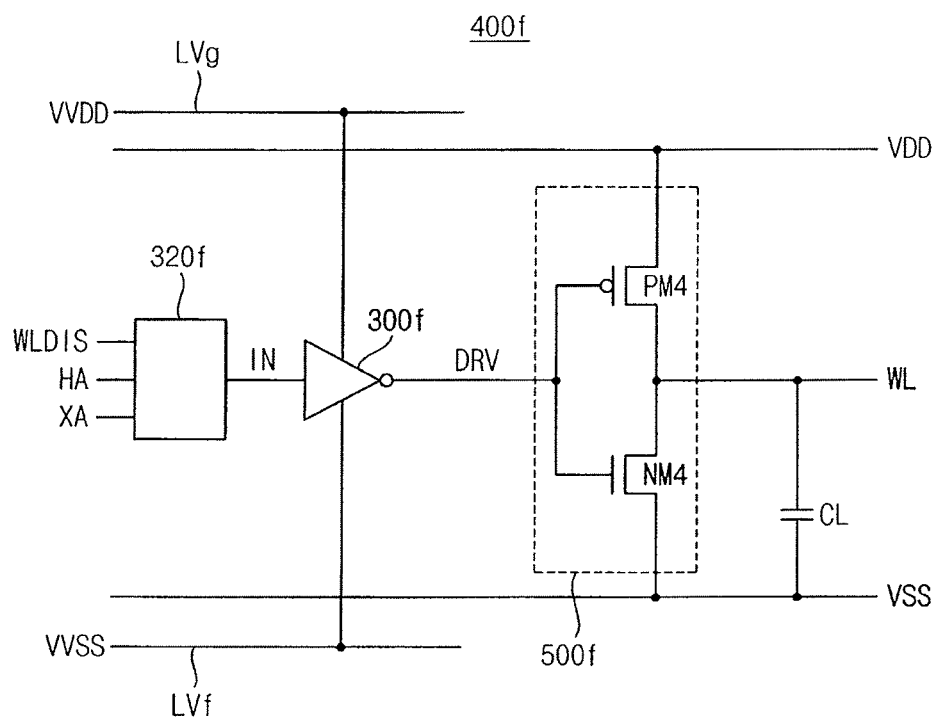
FIG. 14 is a circuit diagram illustrating an example of a wordline driving unit in the semiconductor memory device of FIG. 13.

FIG. 14 is a circuit diagram illustrating an example of a wordline driving unit in the semiconductor memory device of FIG. 13.

Referring to FIG. 14, each wordline driving unit 400f may include a buffer 320f, a driving signal generator 300f and a wordline driver 500f.

For example, the driving signal generator 300g may be implemented as an inverter configured to invert the input signal IN to generate the driving signal DRV. The wordline driver 500g may be implemented as an inverter including a PMOS transistor PM4 as a pull-up transistor and an NMOS transistor NM4 as a pull-down transistor.

The buffer 320f may control the transition timing of the input signal IN based on a first address bit signal HA, a second address bit signal XA and a wordline disable signal WLDIS. The timing of a falling-edge of the driving signal DRV may be controlled in synchronization with the wordline disable signal WLDIS to reduce the wordline disable time in addition to the wordline enable time. In this example, the first virtual power supplier 100f and the second virtual power supplier 100g may operate different timing control signals instead of the common internal clock signal ICK as illustrated in FIG. 13.

As such, to drive a wordline corresponding to a high-capacitive load, the virtual ground voltage VVSS, which is used as one driving voltage by the driving signal generator 300f, may be boosted at the proper timing so that the wordline enable time may be reduced. Also the power supply voltage VVDD, which is used as another driving voltage by the driving signal generator 300f, may be boosted at the proper timing so that the wordline disable time may be reduced.

Figure 15:
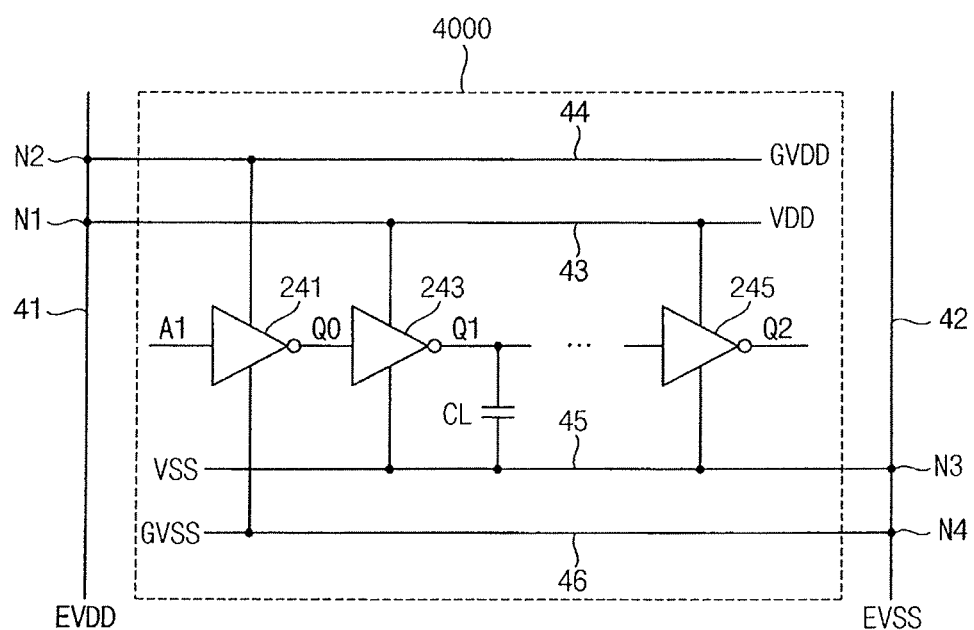
FIG. 15 is a diagram illustrating a semiconductor device according to an exemplary embodiment of the inventive concept.

FIG. 15 is a diagram illustrating a semiconductor device according to an exemplary embodiment of the inventive concept.

Referring to FIG. 15, a semiconductor device 4000 may include a first internal power line 43 and 45, a second internal power line 44 and 46, a driving signal generator 241, and a load driver 243. The semiconductor device 4000 may further include an output buffer 245 configured to generate an output signal Q2, and the semiconductor device 4000 may be powered through an external power line 41 and 42 from an external power source. The first internal power line 43 and 45 may include a power supply voltage line 43 and a ground voltage line 45, the second internal power line 44 and 46 may include a gate power supply voltage line 44 and a gate ground voltage line 46, and the external power line 41 and 42 may include an external power supply voltage line 41 and an external ground voltage line 42.

The first internal power line 43 and 45 provides a driving voltage, and the second internal power line 44 and 46 provides a gate voltage. The driving voltage may include a power supply voltage VDD applied to the power supply voltage line 43 and a ground voltage VSS applied to the ground voltage line 45, and the gate voltage may include a gate power supply voltage GVDD applied to the gate power supply voltage line 44 and a gate ground voltage GVSS applied to the gate ground voltage line 46.

The driving signal generator 241 generates a driving signal Q0 based on the gate voltage GVDD and GVSS provided through the second internal power line 44 and 46. The driving signal generator 241 may generate the driving signal Q0 in response to an input signal A1. The load driver 243 drives a load CL in response to the driving signal Q0 based on the driving voltage VDD and VSS provided through the first internal power line 43 and 45. Even though one driving signal generator 241 and one load driver 243 are illustrated in FIG. 15 for convenience of description, the semiconductor device 4000 may include a plurality of driving signal generators and a plurality of load drivers as will be described with reference to FIG. 21.

According to exemplary embodiments of the inventive concept, the first internal power line 43 and 45 and the second internal power line 44 and 46 may be coupled to different nodes of the external power line for supplying power to the semiconductor device 4000 from an external power source. For example, as illustrated in FIG. 15, the power supply voltage line 43 may be coupled to a first node N1 on the external power supply voltage line 41 and the gate power supply voltage line 44 may be coupled to a second node N2 on the external power supply voltage line 41. In the same way, the ground voltage line 45 may be coupled to a third node N3 on the external ground voltage line 42 and the gate ground voltage line 46 may be coupled to a fourth node N4 on the external ground voltage line 42.

A voltage drop IR DROP may be present on the power lines depending on the operation of the semiconductor device. Such a voltage drop causes the internal power supply voltage VDD to be lower than the external power supply voltage EVDD and the internal ground voltage VGG to be higher than the external ground voltage EVSS, thereby decreasing an operational speed and reliability of the semiconductor device.

Due to the voltage drop on the power lines, the semiconductor device 4000 according to an exemplary embodiment of the inventive concept separates a power supply path to the driving signal generator 241 driving a relatively small load from a power supply path to the load driver 243 driving a relatively large load. Through the separation of the power supply paths, the effects of the voltage drop by the operation of the load driver 243 on the operation of the driving signal generator 241 may be reduced. As a result, the voltage level of the driving signal Q0 output from the driving signal generator 241 may be reinforced through such separation and thus the driving strength of the load driver 243 may be enhanced.

Figure 16:
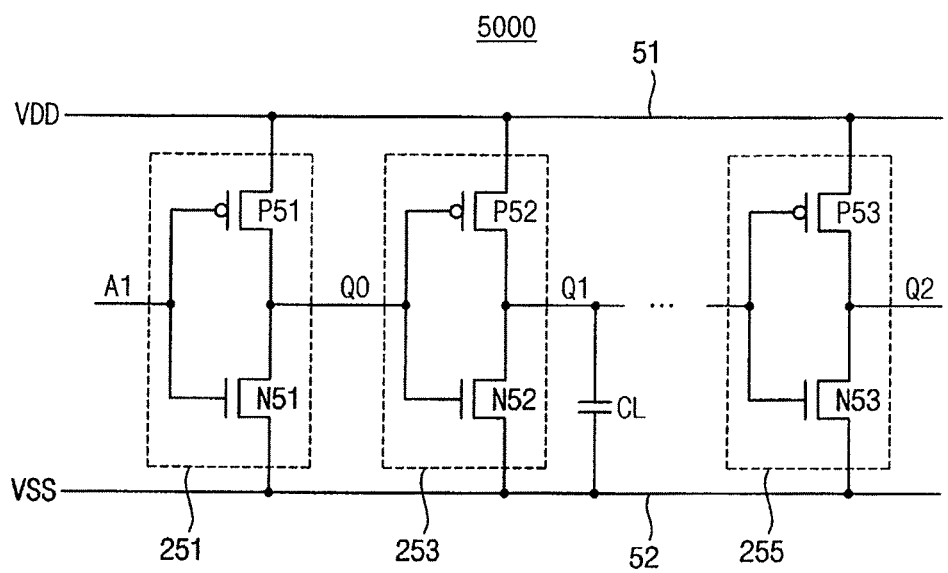
FIG. 16 is a diagram illustrating a semiconductor device for comparison with the semiconductor device of FIG. 15.
Figure 17:
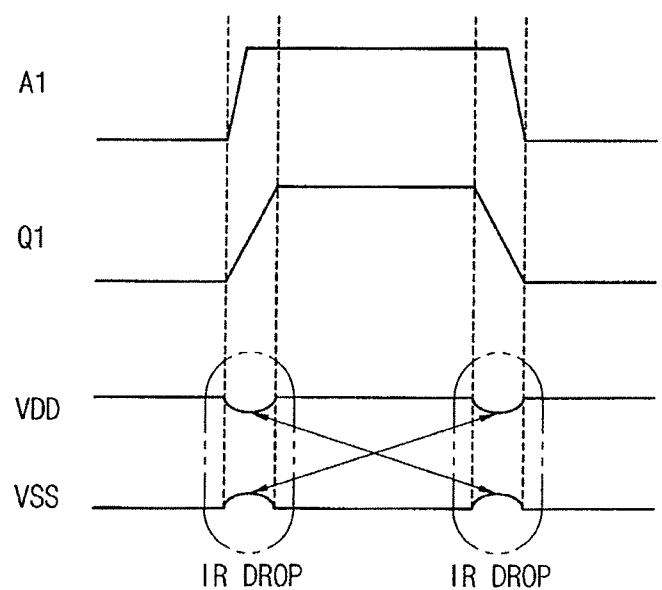
FIG. 17 is a diagram for describing exemplary voltage characteristics of the semiconductor device of FIG. 16.

FIG. 16 is a diagram illustrating a semiconductor device for comparison with the semiconductor device of FIG. 15, and FIG. 17 is a diagram for describing voltage characteristics of the semiconductor device of FIG. 16.

Referring to FIG. 16, a semiconductor device 5000 includes an internal power line 51 and 52, a driving signal generator 251, and a load driver 253. The semiconductor device 5000 may further include an output buffer 255 configured to generate an output signal Q2. The driving signal generator 251, the load driver 253 and the output buffer 255 may be implemented as inverters including one PMOS transistor P51, P52 and P53 and one NMOS transistor N51, N52 and N53.

The internal power line 51 and 52 may provide a driving voltage including the power supply voltage VDD and the ground voltage VSS. The driving signal generator 251 generates a driving signal Q0 based on the driving voltage VDD and VSS provided through the internal power line 51 and 52.

The driving signal generator 251 may generate the driving signal Q0 in response to an input signal A1. The load driver 253 drives a load CL in response to the driving signal Q0 based on the driving voltage VDD and VSS provided through the internal power line 51 and 55. Even though one driving signal generator 251 and one load driver 253 are illustrated in FIG. 16 for convenience of description, the semiconductor device 5000 may include a plurality of driving signal generators and a plurality of load drivers.

The power may be provided from an external power source through an external power line. The external power line may be directly coupled to the internal power line 51 and 52 or via a power gate between the external power line and the internal power line 51 and 52. Power-line bouncing or voltage drop on the internal power line 51 and 52 may be caused due to the inherent resistance of the internal power lines 51 and 52. FIG. 17 shows such a voltage drop IR DROP on the internal power lines 51 and 52.

When the transition time of the load voltage Q1 is important to overall performance of the semiconductor device 5000, the size of the load driver 253 may be increased to enhance the speed of driving the load CL. The size of the load driver 253, however, is limited by design margin and the voltage drop increase as the size of the load 253 increases (e.g., as the driving current is increased).

As represented in FIG. 17, when the input signal A1 and the load voltage Q1 transition from the logic low level to the logic high level, the voltage drop is present on the power supply voltage line 51 since the high-capacitive load CL is charged and thus a bouncing occurs such that the power supply voltage VDD is reduced temporarily. When the input signal A1 and the load voltage Q1 transition from the logic high level to the logic low level, the voltage drop is present on the ground voltage line 52 since the high-capacitive load CL is discharged and thus a bouncing occurs such that the ground voltage VSS is increased temporarily.

If the internal power line 51 and 52, where the voltage drop is caused, is used as the power line of other circuits, the overall performance of the semiconductor device 5000 may be degraded. As understood from Ohm's law V=IR, the voltage drop V depends on the driving current I and the resistance R of the internal power line 51 and 52.

To reduce the voltage drop on the power lines, the driving current I or the resistance R may be reduced. For example, the driving current I may be reduced by reducing the capacitance of the load CL or the number of circuits that are commonly coupled to one power line. The resistance R may be reduced by using power lines of a mesh type. However, use of mesh type power lines may increase the complexity of design and decrease the layout margin.

As described above, the semiconductor device 4000 of FIG. 15 according to an exemplary embodiment of the inventive concept separates a power supply path to the driving signal generator 241 driving a relatively small load from a power supply path to the load driver 243 driving a relatively large load. By separating the power supply path to the driving signal generator 241 disposed directly prior to the load driver 243 driving the large load CL, the performance of the semiconductor 4000 may be enhanced.

Figure 18:
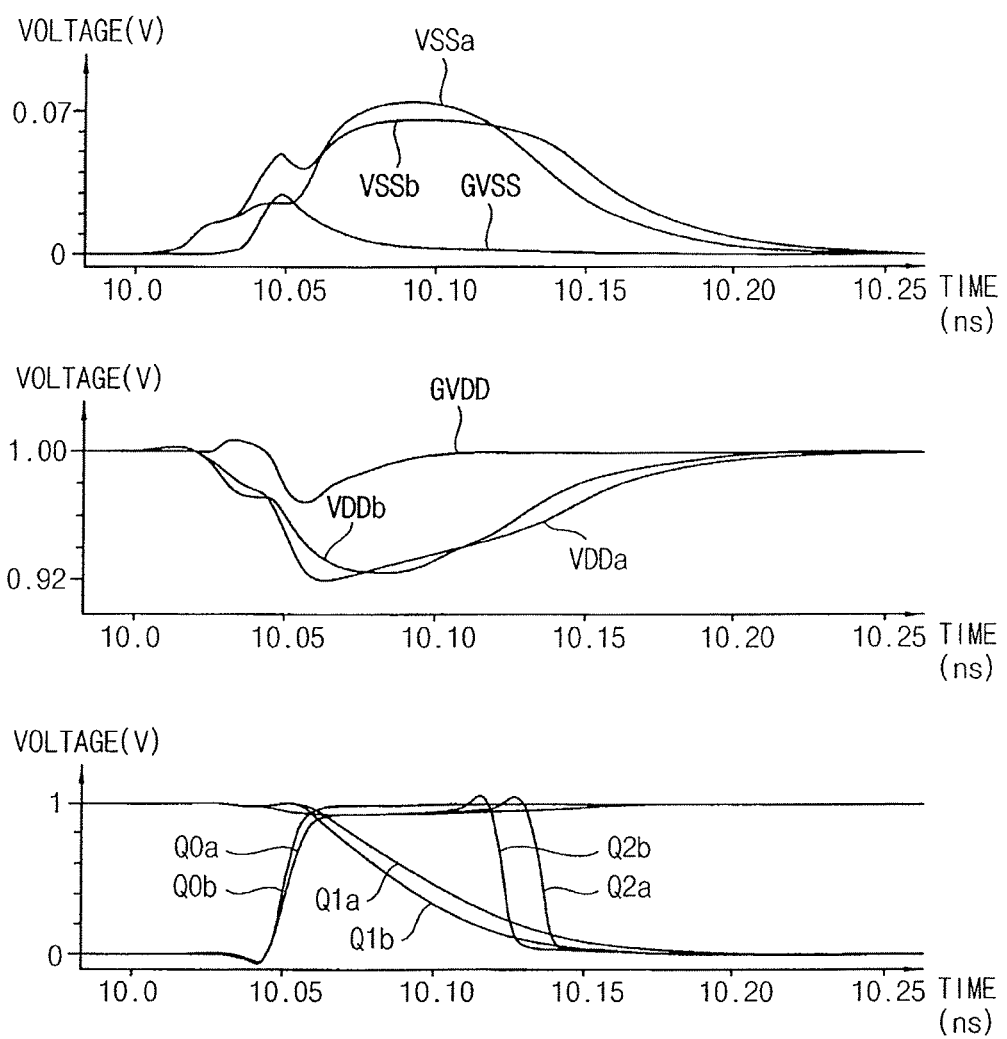
FIG. 18 is a diagram illustrating operational characteristics of the semiconductor device of FIG. 15.

FIG. 18 is a diagram illustrating exemplary operational characteristics of the semiconductor device of FIG. 15.

FIG. 18 illustrates the ground voltage VSSa, the power supply voltage VDDa, the driving signal Q0a, the load voltage Q1a and the output signal Q2a in the semiconductor device 5000 of FIG. 16, and the ground voltage VSSb, the power supply voltage VDDb, the gate ground voltage GVSS, the gate power supply voltage GVDD, the driving signal Q0b, the load voltage Q1b and the output signal Q2b in the semiconductor device of FIG. 15.

The output time of the output signal may be reduced when the second internal power line 44 and 46 is separated from other power lines according to exemplary embodiments of the inventive concept. For example, the output signal Q2b may be output faster than the output signal Q2a as illustrated in FIG. 18. For example, the delay of the signal transfer may be reduced by about 14% in an example where a voltage drop of about 80 mV is present.

Figure 19:
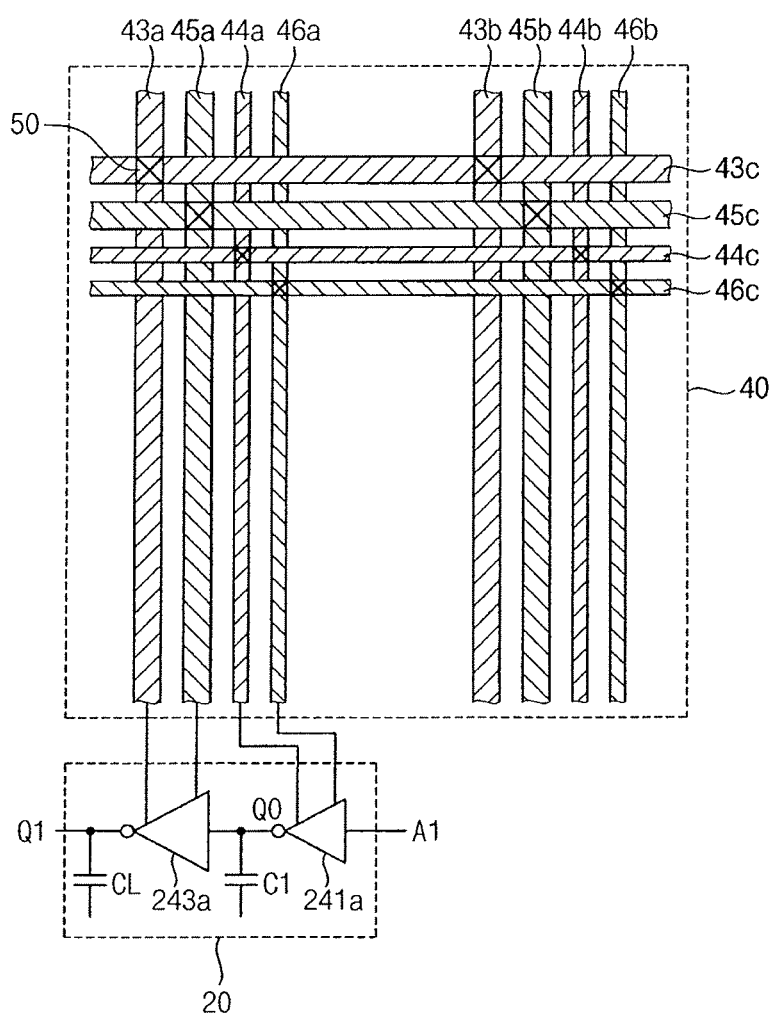
FIG. 19 is a diagram illustrating an example of a wiring layout of the semiconductor device of FIG. 15.

FIG. 19 is a diagram illustrating an example of a wiring layout of the semiconductor device of FIG. 15.

FIG. 19 illustrates schematically an active circuit region 20 formed in the semiconductor substrate and a wiring region 40 of metal layers over the semiconductor substrate.

Referring to FIG. 19, the wiring region 40 may include voltage lines that extend in the row direction and voltage lines that extend in the column direction. For example, the internal power supply voltage VDD may be provided to the active circuit region 20 through the column-directional power supply voltage lines 43a and 43b that are branched from the row-directional power supply voltage line 43c. The internal ground voltage VSS may be provided to the active circuit region 20 through the column-directional ground voltage lines 45a and 45b that are branched from the row-directional ground voltage line 45c. The gate power supply voltage GVDD may be provided to the active circuit region 20 through the column-directional gate power supply voltage lines 44a and 44b that are branched from the row-directional gate power supply voltage line 44c. The gate ground voltage GVSS may be provided to the active circuit region 20 through the column-directional gate ground voltage lines 46a and 46b that are branched from the row-directional gate ground voltage line 46c.

The row-directional lines 43c, 44c, 45c and 46c may be formed in a first metal layer and coupled to the different nodes of the external power line as described above. The column-directional lines 43a, 44a, 45a, 46a, 43b, 44b, 45b and 46b may be formed in a second metal layer under the first metal layer and coupled to the row-directional lines 43c, 44c, 45c and 46c, respectively, through vertical contacts 50 such as a Via.

The active circuit region 20 may include a driving signal generator 241a and a load driver 243a. The load driver 243a driving a relatively large load CL is powered by the power supply voltage VDD and the ground voltage VSS provided through the first internal power line 43a and 45a. The driving signal generator 241a driving a relatively small load C1 is powered by the gate power supply voltage GVDD and the gate ground voltage GVSS provided through the second internal power line 44a and 46a that are separated from the first internal power line 43a and 45a.

In an exemplary embodiment of the inventive concept, a cross-sectional area of the first internal power line 43a and 45a is greater than a cross-sectional area of the second internal power line 44a and 46a so that a resistance of the first internal power line 43a and 45a is less than a resistance of the second internal power line 44a and 46a.

As such, routing the load driver 243a with the relatively thick lines and routing the driving signal generator 241a disposed directly prior to the load driver 243a with the relatively thin lines, the effects of the voltage drop due to the driving operation of the load driver 243a on the operation of the driving signal generator 241a may be reduced.

Figure 20:
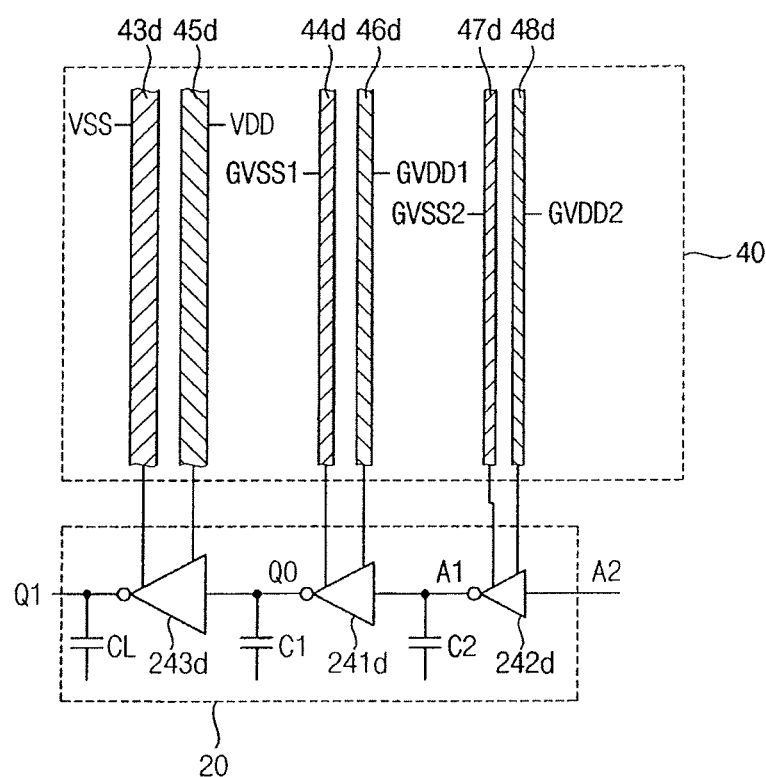
FIG. 20 is a diagram illustrating another example of a wiring layout of the semiconductor device of FIG. 15.

FIG. 20 is a diagram illustrating another example of a wiring layout of the semiconductor device of FIG. 15.

FIG. 20 illustrates schematically an active circuit region 20 formed in the semiconductor substrate and a wiring region 40 formed in metal layers over the semiconductor substrate.

Referring to FIG. 20, a driving voltage VSS and VDD may be provided to the active circuit region 20 through an internal power voltage line 43d and 45d. A first gate voltage GVSS1 and GVDD1 may be provided to the active circuit region 20 through a first gate voltage line 44d and 46d. A second gate voltage GVSS2 and GVDD2 may be provided to the active circuit region 20 through a second gate voltage line 47d and 48d.

As compared with the embodiment of FIG. 19, the second power line 44a and 46a for providing the gate voltage GVSS and GVDD in FIG. 19 is further separated into the first gate voltage line 44d and 46d and the second gate voltage line 47d and 48d in FIG. 20.

The active circuit region 20 may include a buffer 242d, a driving signal generator 241d, and a load driver 243d. The load driver 243d driving a relatively large load CL is powered by the driving voltage VDD and VSS provided through the internal power voltage line 43d and 45d and the driving signal generator 241d driving a relatively small load C1 is powered by the first gate voltage GVSS1 and GVDD1 through the first gate voltage line 44d and 46d separated from the internal power voltage line 43d and 45d.

When the capacitance C2 is relatively large and the resistance of the first gate voltage line 44d and 46d is relatively large to cause the voltage drop thereon, the power supply path to the buffer 242d disposed directly prior to the driving signal generator 241d may be further separated from the power supply path to the driving signal generator 241d. For example, the buffer 242d may be powered by the second gate voltage GVSS2 and GVDD2 provided through the second gate voltage line 47d and 48d that is separated from the internal power voltage line 43d and 45d and the first gate voltage line 44d and 46d.

In an exemplary embodiment of the inventive concept, a cross-sectional area of the internal power voltage line 43d and 45d is greater than a cross-sectional area of the first gate voltage line 44d and 46d so that a resistance of the internal power voltage line 43d and 45d is less than a resistance of the first gate voltage line 44d and 46d, as illustrated in FIG. 20. The cross-sectional area of the first gate voltage line 44d and 46d may also be greater than a cross-sectional area of the second gate voltage line 47d and 48d so that a resistance of first gate voltage line 44d and 46d is smaller than a resistance of the second gate voltage line 47d and 48d.

As such, by separating the power supply paths, the effects of a voltage drop due to the operation of the pre-stage on the operation of the post-stage may be reduced.

Figure 21:
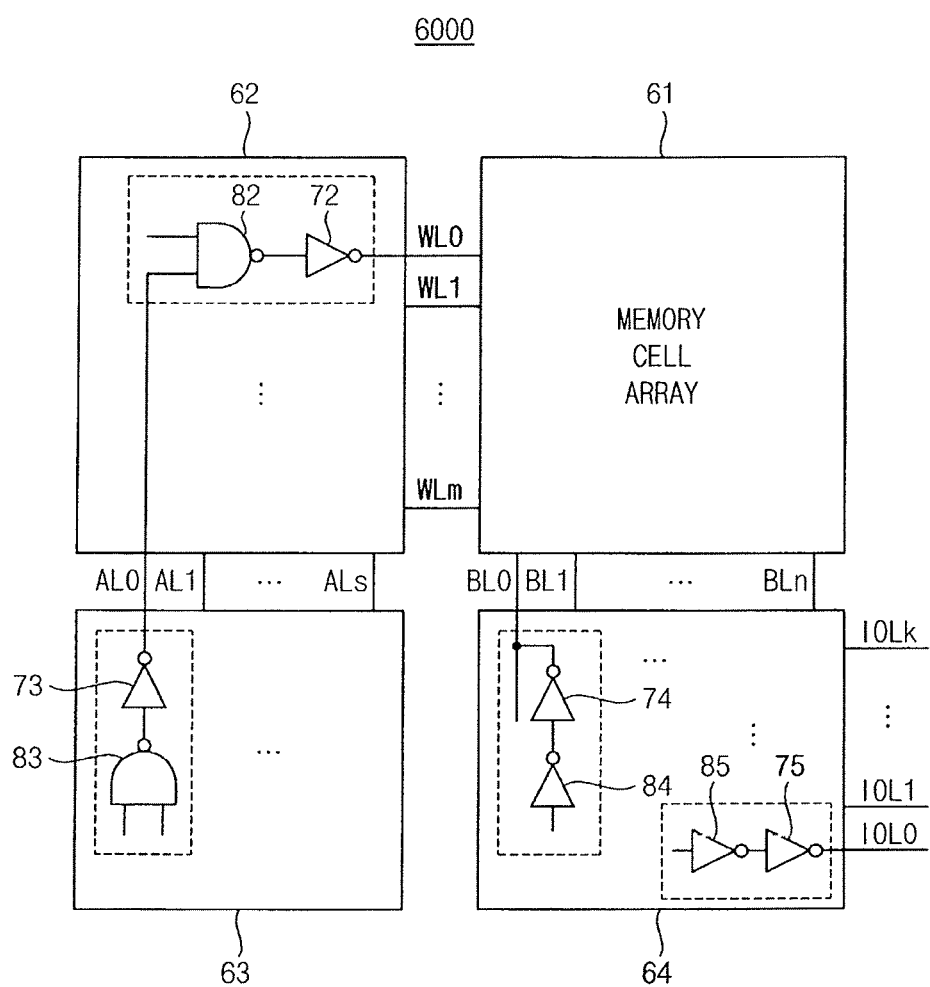
FIG. 21 is a diagram illustrating a semiconductor memory device according to an exemplary embodiment of the inventive concept.

FIG. 21 is a diagram illustrating a semiconductor memory device according to an exemplary embodiment of the inventive concept.

Referring to FIG. 21, a semiconductor memory device 6000 includes a memory cell array 61, a wordline driving circuit 62, a row decoder 63 and an input-output circuit 64.

The memory cell array 61 includes a plurality of memory cells MC coupled to a plurality of wordlines WL0 to WLm and a plurality of bitlines BL0 to BLn. The semiconductor memory device 6000 may be a volatile memory device such as a dynamic random access memory (DRAM), a static random access memory (SRAM), etc. or a non-volatile memory device such as a flash memory, a resistive memory, etc. The memory cell MC may have various configurations depending on the memory type. The wordlines WL0 to WLm may extend along a row direction and the bitlines BL0 to BLn may extend along a column direction.

The wordline driving circuit 62 may include a plurality of driving units configured to drive the wordlines WL0 to WLm, respectively, and each of the driving units may include a driving signal generator 82 and a wordline driver 72. The row decoder 63 may include a plurality of driving units configured to drive the address lines AL0 to ALs, respectively, and each of the driving units may include a driving signal generator 83 and a decoder driver 73. The input-output circuit 64 may include a plurality of driving units configured to drive the bitlines BL0 to BLn, respectively, and each of the driving units may include a driving signal generator 84 and a bitline driver 74. In addition, the input-output circuit 64 may include a plurality of driving units configured to drive the output lines IOL0 to IOLk, respectively, and each of the driving units may include a driving signal generator 85 and an output driver 75.

As described with reference to FIG. 15, the wordline driver 72, the decoder driver 73, the bitline driver 74 and the output driver 75, which drive directly the high-capacitive loads such as the wordlines WL0 to WLm, the address lines AL0 to ALs, the bitlines BL0 to BLn and the output lines IOL0 to IOLk, may be powered by the driving voltage VDD and VSS provided through the first internal power lines 43 and 45. In contrast, the driving signal generators 82, 83, 84 and 85, which are disposed directly prior to the drivers 72, 73, 74 and 75, may be powered by the gate voltages GVDD and GVSS provided through the second internal power lines 44 and 46 separated from the first internal power lines 43 and 45. For example such separation may be implemented by connecting the first internal power lines 43 and 45 and the second internal power lines 44 and 46 to the different nodes of the external power lines 41 and 42.

As the number of drivers powered through the common power line is increased, the voltage drop on the power line is increased. As described above, by separating the power supply paths between the drivers 72, 73, 74 and 75 driving the high-capacitive loads and the driving signal generators 82, 83, 84 and 85 disposed prior to the drivers 72, 73, 74 and 75, the effects of a voltage drop due to the operation of the pre-stage on the operation of the post-stage may be reduced.

Figure 22:
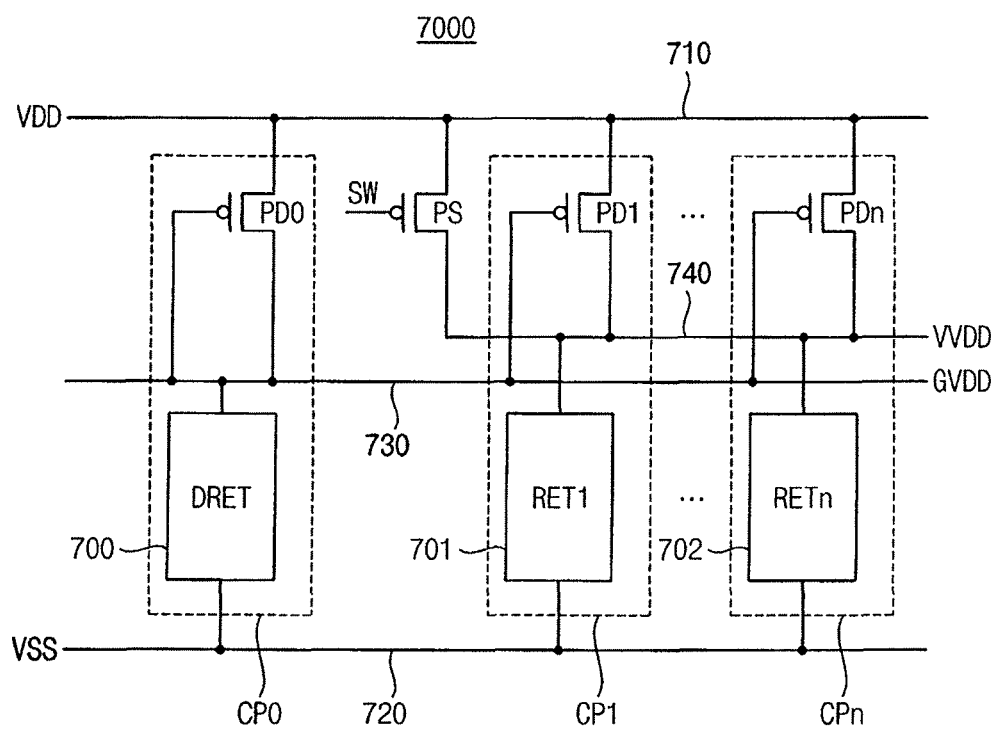
FIG. 22 is a diagram illustrating a semiconductor device according to an exemplary embodiment of the inventive concept.

FIG. 22 is a diagram illustrating a semiconductor device according to exemplary embodiment of the inventive concept.

Referring to FIG. 22, a semiconductor device 7000 includes a dummy power diode PD0, a dummy retention circuit DRET 700, one or more power diodes PD1 and PDn and one or more retention circuits RET1 and RETn 701 and 702.

The dummy power diode PD0 is coupled between a power supply voltage line 710 providing a power supply voltage VDD and a gate voltage line 730 providing a gate voltage GVDD, and a gate of the dummy power diode PD0 is coupled to the gate voltage line 730. The dummy retention circuit 700 is coupled between the gate voltage line 730 and a ground voltage line 720 providing a ground voltage VSS. The power diodes PD1 and PDn are coupled in parallel between the power supply voltage line 710 and a virtual power supply voltage line 740 providing a virtual power supply voltage VVDD, and gates of the power diodes PD1 and PDn are coupled to the gate voltage line 730. The retention circuits 701 and 702 are coupled in parallel across the virtual power supply voltage line 740 and the ground voltage line 720.

The semiconductor device 7000 may further include a power switch PS coupled between the power supply voltage line 710 and the virtual power supply voltage line 740. The power switch PS may be implemented with a PMOS transistor that is turned on and turned off in response to a switch signal SW. For example, a logic low level of the switch signal SW may represent a normal operation mode of the semiconductor device 7000 and a logic high level of the switch signal SW may represent a power-down mode of the semiconductor device 7000.

To reduce power consumption due to a leakage current in the power-down mode, the power switch and/or the power diodes PD1 and PDn may be used as illustrated in FIG. 22. The power switch PS is turned on and applies the power supply voltage VDD to the virtual power supply voltage line 740 to increase the operation speed of the powered circuits in the normal operation mode, and the power switch PS is turned off to reduce power consumption in the power-down mode. The power diodes PD1 and PDn are turned on in the power-down mode instead of the power switch PS to provide the virtual power supply voltage VVDD, which is lower than the power supply voltage VDD, to the virtual power supply voltage line 740.

The virtual power supply voltage VVDD should be higher than a retention voltage Vr to retain data or information stored in the retention circuits 701 and 702 during the power-down mode. The power reduction and the data retention during the power-down mode may be realized using the power diodes PD1 and PDn. Discrepancies in the power diodes PD1 and PDn and the retention circuits 701 and 702 may be caused due to variations of a manufacturing process. Thus the virtual power supply voltage VVDD may become lower than the retention voltage Vr in some circumstances, thereby causing the loss of data stored in the retention circuits 701 and 702.

The semiconductor device 7000 according to exemplary embodiments of the inventive concept includes a dummy current path CP0 and one or more retention current paths CP1 and CPn. Each retention current path may include the power diode and the retention circuit. As compared with a power gating schemes in which the gate of the power diode is coupled to the virtual power supply voltage line as will be described with reference to FIG. 23, the gates of the power diodes PD1 and PDn are coupled to the gate voltage line 730 in the semiconductor device 7000 according to at least one exemplary embodiment of the inventive concept. In at least one exemplary embodiment of the inventive concept, a resistance of the dummy retention circuit 700 is less than a resistance of each of the retention circuits 701 and 702 so that the gate voltage GVDD provided by the gate voltage line 730 is lower than the virtual power supply voltage VVDD provided by the virtual power supply voltage line 740.

According to the above mentioned configuration, the drop in voltage of the virtual power supply voltage VVDD depending on the variations of the manufacturing process may be reduced since the current through the power diodes PD1 and PDn may be increased by applying the gate voltage GVDD, instead of the virtual power supply voltage VVDD, to the gates of the power diodes PD1 and PDn. Accordingly, the probability of data loss may be reduced by use of a virtual power supply voltage VVDD that is less sensitive to the variations of the manufacturing process, as will be further described with reference to FIGS. 23 and 24.

Figure 23:
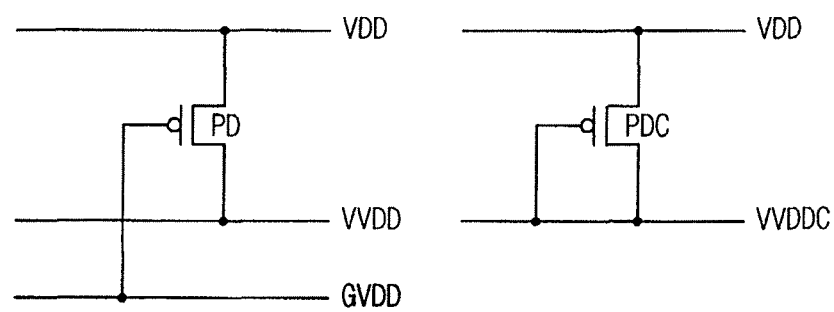
FIG. 23 is a diagram illustrating a connection of a power diode in the semiconductor device of FIG. 11.
Figure 24:
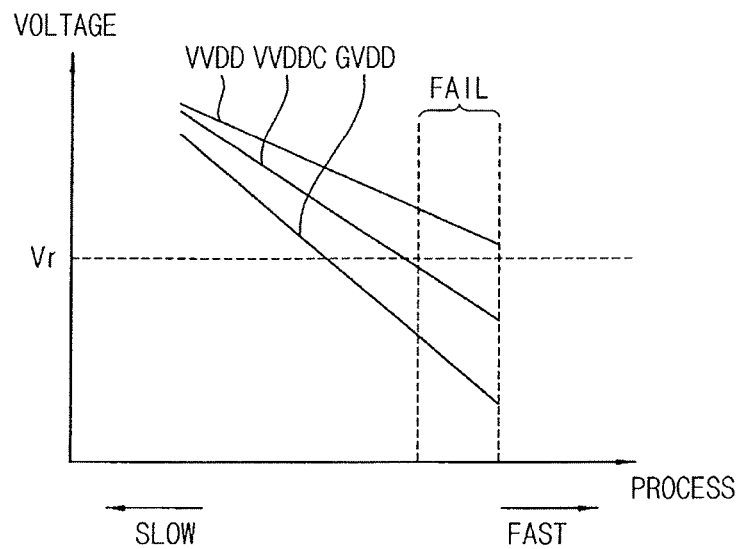
FIG. 24 is a diagram illustrating exemplary operational characteristics of the power diodes of FIG. 23.

FIG. 23 is a diagram illustrating a connection of a power diode in the semiconductor device of FIG. 11 and a connection of another power diode, and FIG. 24 is a diagram illustrating exemplary operational characteristics of the power diodes of FIG. 23.

Referring to FIG. 23, the power diode PD according to exemplary embodiments of the inventive concept is coupled between the power supply voltage VDD and the virtual power supply voltage VVDD and its gate is coupled to the gate voltage GVDD. In contrast, the other power diode PDC is coupled between the power supply voltage VDD and the virtual power supply voltage VVDDC and its gate is also coupled to the virtual power supply voltage VVDDC. The resistance of the dummy retention circuit 700 may be set so that the gate voltage GVDD is lower than the virtual power supply voltage VVDDC corresponding to the other diode-connection.

Referring to FIG. 24, the virtual power supply voltage VVDD according to exemplary embodiments of the inventive concept have a voltage level higher than the power supply voltage VVDDC, since the gate voltage GVDD is set to have a voltage level lower than the power supply voltage VVDDC.

When the power diode PDC has a relatively small turn-on resistance and the retention circuit has a relatively large resistance (e.g., when the manufacturing process corresponds to a SLOW case), the virtual power supply voltage VVDDC may be larger than the retention voltage Vr and data loss may be avoided. In a stressed condition, however, when the power diode PDC has a relatively large turn-on resistance and the retention circuit has a relatively small resistance (e.g., when the manufacturing process corresponds to a FAST case), the virtual power supply voltage VVDDC may be decreased to the voltage level lower than the retention voltage Vr and thus the semiconductor device is considered to have failed.

In contrast, the power diode PD according to exemplary embodiments of the inventive concept may maintain the voltage level larger than the retention voltage Vr even in the stressed condition, since the gate voltage GVDD is decreased depending on the manufacturing process, thereby increasing the virtual power supply voltage VVDD as compared with the virtual power supply voltage VVDDC.

Figure 25:
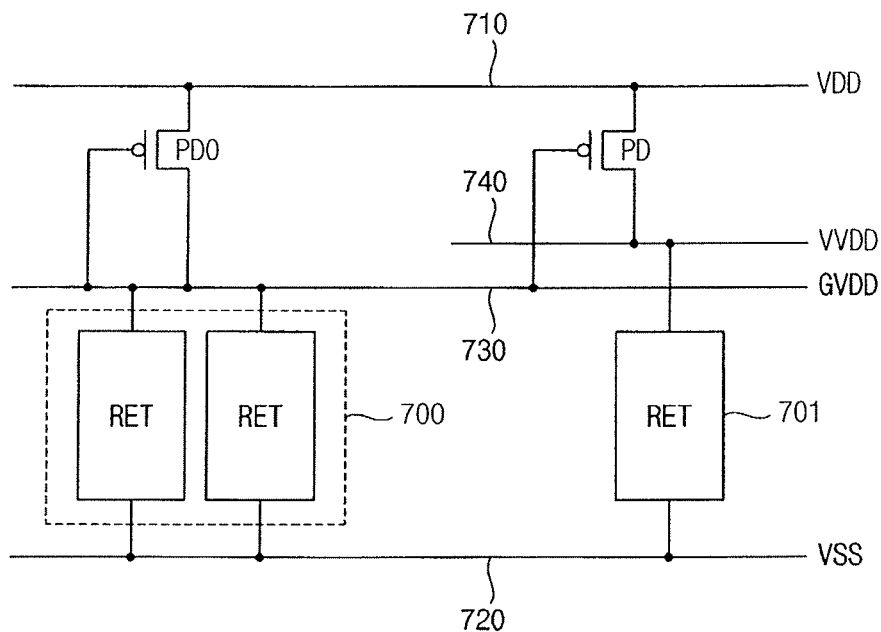
FIG. 25 is a diagram illustrating a dummy retention circuit in the semiconductor device of FIG. 22.

FIG. 25 is a diagram illustrating a dummy retention circuit in the semiconductor device of FIG. 22.

Referring to FIG. 25, a dummy retention circuit 700 may include a plurality of dummy circuits RETs coupled in parallel between the gate voltage line 730 and the ground voltage line 750 such that each dummy circuit RET has the same configuration as the retention circuit 701. In this example, the resistance of the dummy retention circuit 700 is less than the resistance of the retention circuit 701, and thus the gate voltage GVDD may be lower than the virtual power supply voltage VVDD as illustrated in FIG. 24.

The dummy retention circuit 700 and the retention circuits 701 and 702 may be formed through the same manufacturing process to have the same operational characteristics. As mentioned above, the operational characteristics of the dummy retention circuit 700 and the retention circuits 701 and 702 may be varied depending on the variation of the manufacturing process of the semiconductor device. The virtual power supply voltage VVDD may be very sensitive to variations of the manufacturing process.

Figure 26:
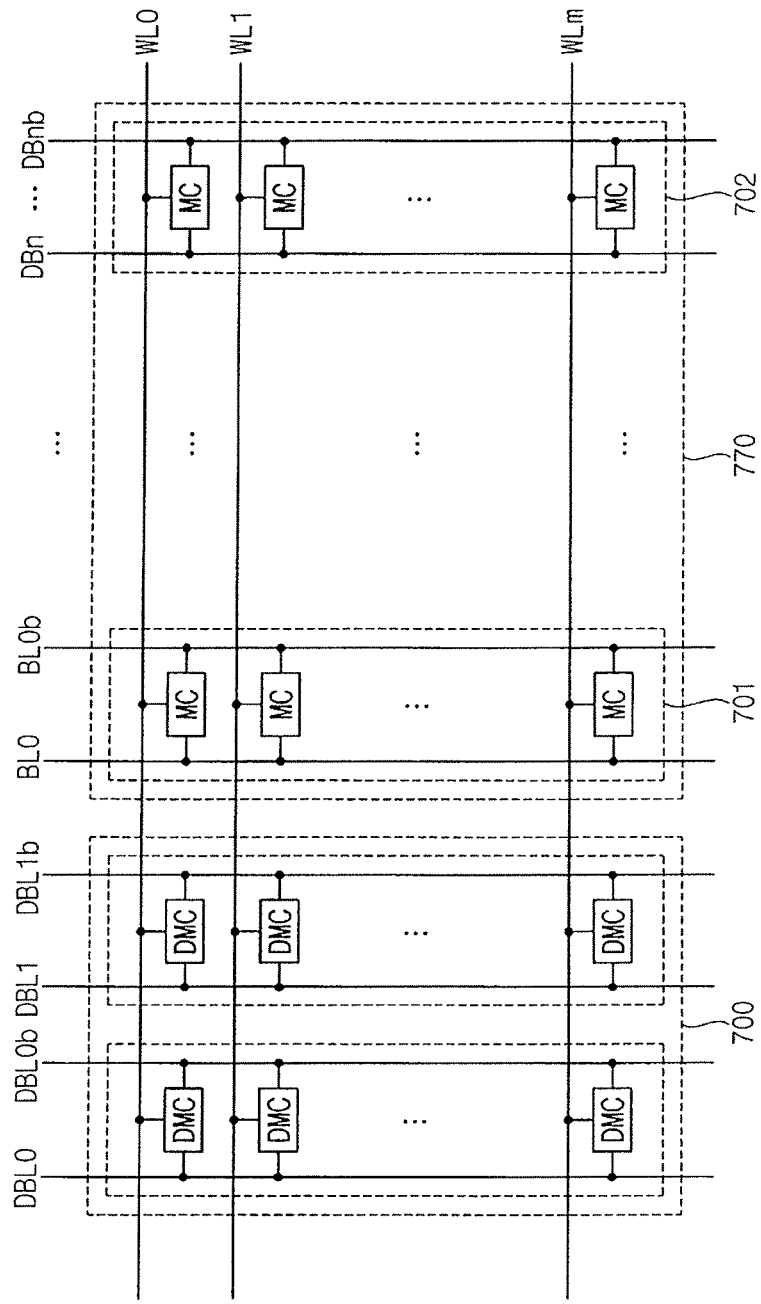
FIG. 26 is a diagram illustrating a semiconductor memory device according to an exemplary embodiment of the inventive concept.

For example, the retention circuit 701 may include a plurality of memory cells MC coupled to a bitline pair as illustrated in FIG. 26. In this example, the virtual power supply voltage VVDD may be increased as the number of the power diodes PD is increased to increase the sourcing current from the power supply voltage line 710. In contrast, the virtual power supply voltage VVDD may be decreased as the number of the memory cells is increased to increase the sinking current to the ground voltage line 720.

The design of the power diodes in relationship to the entire process can be optimized to ensure that the virtual power supply voltage VVDD is higher than the retention voltage Vr. Such optimization, however, can be difficult because the variation of the threshold voltage of the power diode and the variation of the resistance of the retention circuit are different from each other. If the threshold voltage of the power diode is designed to be decreased, the power consumption is increased during the power-down mode.

By forming the dummy retention circuit 700 and the retention circuit 701 through the same manufacturing process, the power consumption may be reduced and a stable virtual power supply voltage VVDD for data retention may be realized in the power-down mode.

FIG. 26 is a diagram illustrating a semiconductor memory device according to an exemplary embodiment of the inventive concept.

For convenience of description, the other components are omitted in FIG. 26 except a dummy retention circuit 700 and a memory cell array 770 corresponding to the retention circuits 701 and 702 of FIG. 22.

Referring to FIG. 26, one retention circuit powered through one power diode may correspond to each of bit-cell arrays 701 and 702. Each bit-cell array 701 and 702 may include a plurality of the memory cells MC coupled to each bitline pair BL0/BL0b and BLn/BLnb. As will be described with reference to FIG. 27, the memory cell MC may be a SRAM cell that is powered during the power-down mode.

The dummy retention circuit 700 may include a plurality of dummy bit-cell arrays such that each dummy bit-cell array has the same configuration as each of the bit-cell array 701 and 702. FIG. 26 illustrates an example that the dummy retention circuit 700 includes two dummy bit-cell arrays. However, embodiments of the inventive concept are not limited thereto. For example, more than two dummy bit-cell arrays may be present in alternate embodiments. Each dummy bit-cell array includes a plurality of dummy memory cells DMC coupled to each dummy bitline pair DBL0/DBL0b and DBL1/DBL1b. As described above, the dummy retention circuit 700 and the memory cell array 770 corresponding to the retention circuits may be formed through the same manufacturing process to have the same operational characteristics. The dummy memory cells DMC and the memory cells MC in the same row may share the wordline WL0, WL1 and WLm.

Figure 27:
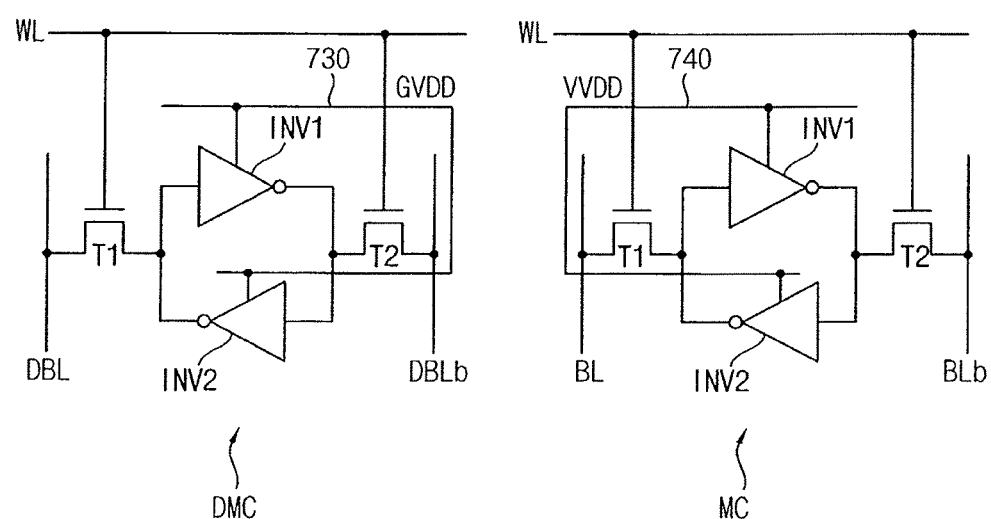
FIG. 27 is a circuit diagram illustrating a dummy memory cell and a memory cell in the semiconductor device of FIG. 26.

FIG. 27 is a circuit diagram illustrating a dummy memory cell and a memory cell in the semiconductor device of FIG. 26.

The dummy memory cell DMC and the memory cell MC of FIG. 26 may be implemented as the SRAM cells as illustrated in FIG. 27. The memory cell MC may include two inverters INV1 and INV2 and transistors T1 and T2. The inverters INV1 and INV2 form a latch and the transistors T1 and T2 have gates connected to the wordline WL and control electrical connections between the latch and the bitline pair BL/BLb. The dummy memory cell DMC may include two inverters INV1 and INV2 and transistors T1 and T2. The inverters INV1 and INV2 form a latch and the transistors T1 and T2 have gates connected to the wordline WL and control electrical connections between the latch and the dummy bitline pair DBL/DBLb.

The memory cell MC is powered by the virtual power supply voltage VVDD provided through the virtual power supply voltage line 740, whereas the dummy memory cell DMC is powered by the gate voltage GVDD provided through the gate voltage line 730. As described above, the gate voltage GVDD may be applied to the gate of the power diode that is configured to supply a power to the memory cell MC. The gate voltage GVDD may be set to be lower than the virtual power supply voltage VVDD so that the virtual power supply voltage VVDD is higher than the retention voltage Vr during the power-down mode, thereby stably retaining the data stored in the latch of the memory cell MC.

Figure 28:
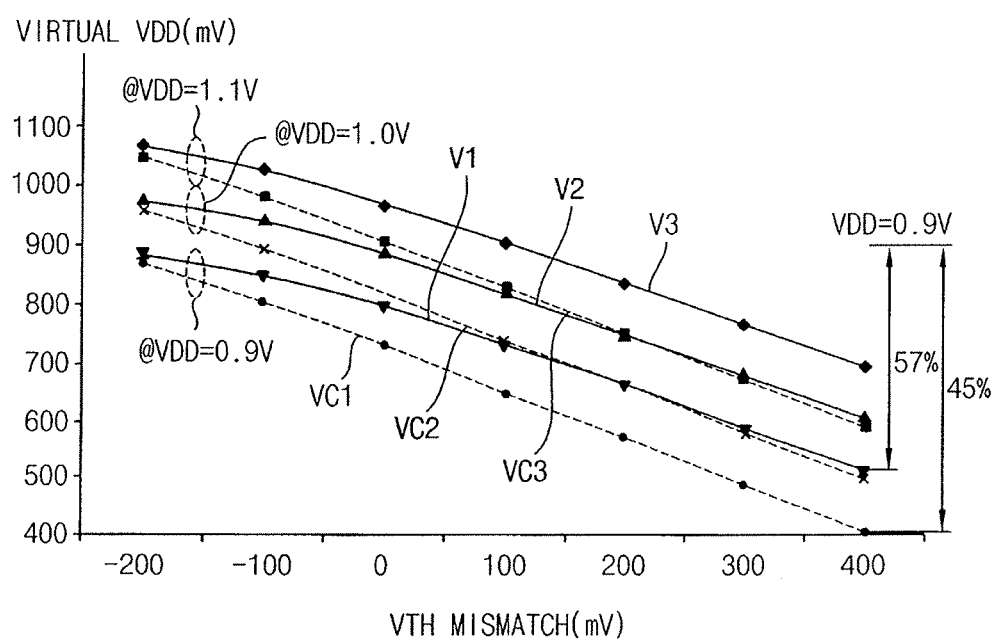
FIG. 28 is a diagram illustrating exemplary operational characteristics of the semiconductor device of FIG. 22.

FIG. 28 is a diagram illustrating exemplary operational characteristics of the semiconductor device of FIG. 22.

In FIG. 28, the horizontal axis represents a mismatch of the threshold voltage of the power diode according to a variation in the manufacturing process, and the vertical axis represents the virtual power supply voltage VVDD. The variation may include a pressure, voltage, or temperature PVT variation. V1, V2 and V3 represent the virtual power supply voltage VVDD having the power-diode connection according to exemplary embodiments of the inventive concept, and VC1, VC2 and VC3 represent the virtual power supply voltage VVDDC of the other power-diode connection. V1 and VC1 correspond to a case where the power supply voltage VDD is 0.9V, V2 and VC2 correspond to a case where the power supply voltage VDD is 1.0V, and V3 and VC3 correspond to a case where the power supply voltage VDD is 1.1V.

As shown in FIG. 28, the voltage levels V1, V2 and V3 according to an exemplary embodiment of the invention is higher than the voltage levels of VC1, VC2 and VC3 that make use of the other power-diode connection.

For example, referring to the case of VDD=0.9V, the voltage level of V1 is 57% of VDD with respect to the case with the largest mismatch, whereas the voltage level of VC1 is 45% of VDD, even though there is a small difference between V1 and VC1 with respect to the case with the smallest mismatch.

At least one of the exemplary embodiments described above may be incorporated into semiconductor devices and systems requiring high speed, low power consumption and high reliability (e.g., mobile devices).

The foregoing is illustrative of exemplary embodiments of the inventive concept and is not to be construed as limiting thereof. Although a few exemplary embodiments have been described, many modifications can be made in the exemplary embodiments without materially departing from the present inventive concept. Accordingly, all such modifications are intended to be included within the scope of the present inventive concept.

What is claimed is:

1. A semiconductor device comprising:
    a first internal power line configured to provide a driving voltage comprising a power supply voltage and a ground voltage, the first internal power line comprising a first signal line configured to provide the power supply voltage and a second signal line configured to provide the ground voltage;
    a second internal power line configured to provide a gate voltage comprising a gate power supply voltage and a gate ground voltage, the second internal power line comprising a third signal line configured to provide the gate power supply voltage and a fourth signal line configured to provide the gate ground voltage;
    a plurality of driving signal generators configured to generate a plurality of driving signals based on the gate voltage; and
    a plurality of load drivers configured to drive a plurality of loads based on the driving voltage and the driving signals,
    wherein the first signal line is connected to a first node of an external power line, and the third signal line is connected to a second node of the external power line, the second node being different from the first node, and
    wherein a cross-sectional area of the first internal power line is greater than a cross-sectional area of the second internal power line and a resistance of the first internal power line is less than a resistance of the second internal power line.

2. The semiconductor device of claim 1, wherein the semiconductor device is a semiconductor memory device and the plurality of load drivers are a plurality of wordline drivers configured to drive a plurality of wordlines, respectively.

3. The semiconductor device of claim 1, wherein the semiconductor device is a semiconductor memory device and the plurality of load drivers are a plurality of bitline drivers configured to drive a plurality of bitlines, respectively.

4. The semiconductor device of claim 1, wherein the semiconductor device is a semiconductor memory device and the plurality of load drivers are a plurality of decoder drivers configured to drive a plurality of address lines, respectively.

5. The semiconductor device of claim 1, wherein the plurality of load drivers are a plurality of output drivers configured to drive a plurality of output lines, respectively.

6. The semiconductor device of claim 1, wherein the second signal line is connected to a third node of an external ground line, and the fourth signal line is connected to a fourth node of the external ground line, the third node being different from the fourth node.

7. The semiconductor device of claim 6, wherein the third and fourth signal lines are connected to the driving signal generators.

8. The semiconductor device of claim 7, wherein the first and second signal lines are connected to the load drivers.

9. The semiconductor device of claim 1, wherein at a given time, the ground voltage is higher than the gate ground voltage, and at a given time, the power supply voltage is lower than the gate power supply voltage.

10. A semiconductor device comprising:
a first internal power line configured to provide a driving voltage;
a second internal power line configured to provide a gate voltage;
a plurality of driving signal generators configured to generate a plurality of driving signals based on the gate voltage; and
a plurality of load drivers configured to drive a plurality of loads based on the driving voltage and the driving signals,
wherein a cross-sectional area of the first internal power line is greater than a cross-sectional area of the second internal power line, and
wherein a resistance of the first internal power line is less than a resistance of the second internal power line.

11. The semiconductor device of claim 10, wherein the first internal power line is connected to a first node of an external power line, and the second internal power line is connected to a second node of the external power line, the second node being different from the first node.

12. The semiconductor device of claim 11, wherein the first internal power line is connected to a third node of an external ground line, and the second internal power line is connected to a fourth node of the external ground line, the third node being different from the fourth node.

* * * * *